(12) United States Patent
McDaniel et al.

(10) Patent No.: US 7,517,754 B2
(45) Date of Patent: *Apr. 14, 2009

(54) METHODS OF FORMING SEMICONDUCTOR CONSTRUCTIONS

(75) Inventors: Terrence B. McDaniel, Boise, ID (US); Scott A. Southwick, Boise, ID (US); Fred D. Fishburn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/971,747

(22) Filed: Jan. 9, 2008

(65) Prior Publication Data

US 2008/0113501 A1 May 15, 2008

Related U.S. Application Data

(63) Continuation of application No. 11/099,972, filed on Apr. 6, 2005, now Pat. No. 7,341,909.

(51) Int. Cl.
*H01L 21/8242* (2006.01)
*H01L 21/4763* (2006.01)

(52) U.S. Cl. ............... 438/253; 438/239; 438/618; 438/625; 257/E21.646; 257/E23.169

(58) Field of Classification Search ............. 438/239, 438/253, 618, 625

See application file for complete search history.

(56) References Cited

U.S. PATENT DOCUMENTS 7,341,909 B2 * 3/2008 McDaniel et al. ........... 438/253
2005/0236656 A1 * 10/2005 Tran et al. .................. 257/296

* cited by examiner

*Primary Examiner*—Alexander G Ghyka
(74) *Attorney, Agent, or Firm*—Wells St. John P.S.

(57) ABSTRACT

The invention includes methods of forming semiconductor constructions in which electrically conductive structures are formed between bitlines to electrically connect with storage node contacts. The bitlines can be formed within trenches having faceted top portions. The invention also includes semiconductor structures containing trenches with faceted top portions, and containing bitlines within the trenches.

19 Claims, 21 Drawing Sheets

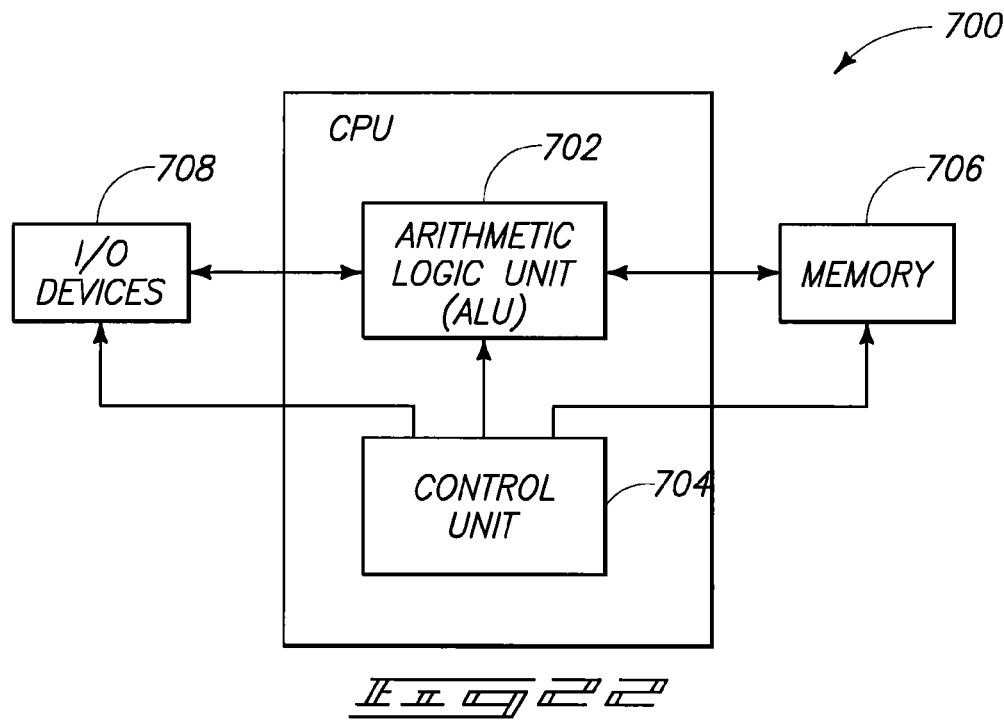
_Fig. 22_
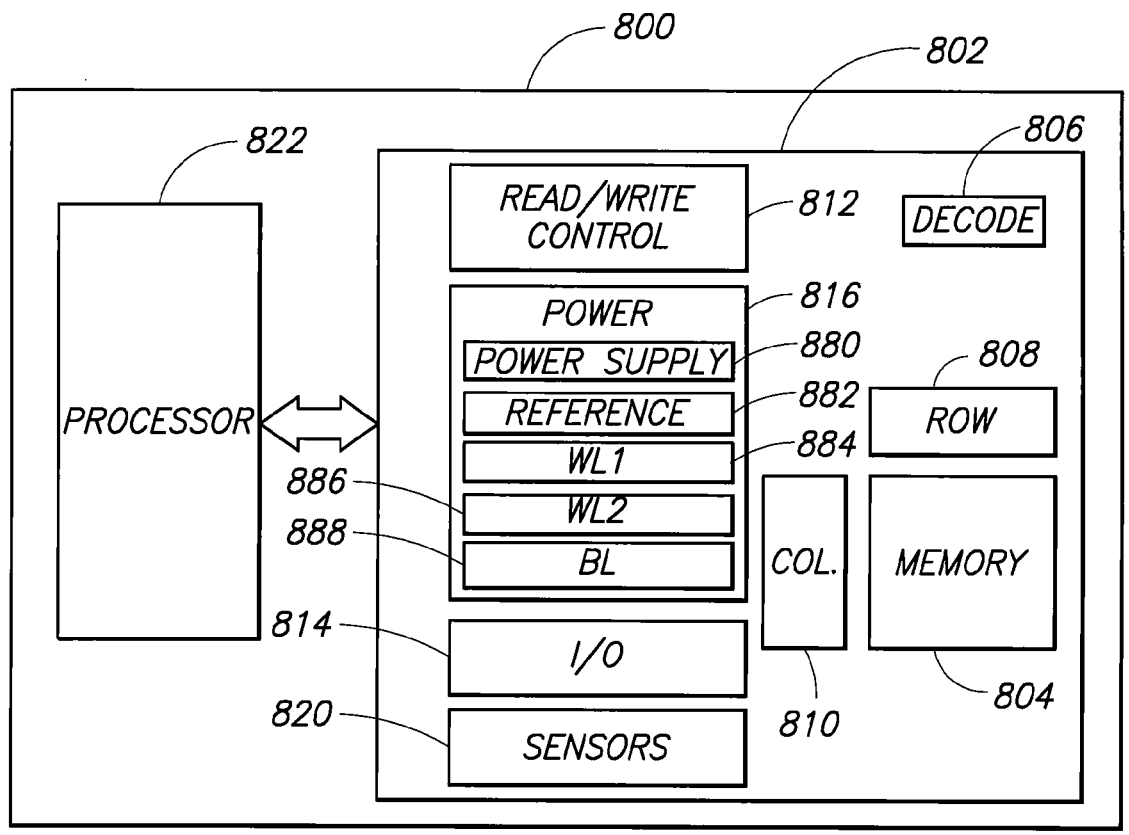
_Fig. 23_

METHODS OF FORMING SEMICONDUCTOR CONSTRUCTIONS

RELATED PATENT DATA

This patent resulted from a continuation application of U.S. patent application Ser. No. 11/099,972, which was filed Apr. 6, 2005, which issued as U.S. Pat. No. 7,341,909 on Mar. 11, 2008, and which is hereby incorporated herein by reference.

TECHNICAL FIELD

The invention pertains to semiconductor structures, and to methods of forming semiconductor constructions.

BACKGROUND OF THE INVENTION

Semiconductor memory constructions typically comprise arrays of tightly-spaced lines (bitlines and wordlines), together with data storage structures. For instance, dynamic random access memory (DRAM) comprises tightly-spaced wordlines and bitlines together with capacitors, with the capacitors being utilized as data storage devices.

The semiconductor memory constructions are typically integrated with other circuitry on a single semiconductor chip. Such other circuitry is provided peripherally to the memory array, and can be utilized, for example, for reading of information from the memory array or writing of information to the memory array.

Continuing goals during semiconductor chip fabrication are to increase the level of integration while maintaining, or even improving, device performance; to increase device throughput; and to reduce costs. Accordingly, it is desirable to develop improved methods for fabrication of integrated circuitry. It is also desirable to develop integrated circuitry having improved performance characteristics.

SUMMARY OF THE INVENTION

In one aspect, the invention encompasses a method of forming a semiconductor construction. A substrate is provided to have a defined memory array region. The substrate comprises, within the memory array region, a plurality of storage node contacts within an insulative material. The storage node contacts have uppermost surfaces covered by the insulative material. Trenches are formed within the insulative material. Electrically conductive bitline material is formed to fill the trenches. The bitline material is patterned into a plurality of spaced bitlines. At least portions of individual bitlines are elevationally above the storage node contact uppermost surfaces. Insulative caps are formed within the trenches and over the bitlines. After the bitline material is formed, and before the insulative caps are formed, electrically conductive structures are formed to extend through the insulative material in locations between the bitlines. The electrically conductive structures extend to the storage node contacts.

In one aspect, the invention encompasses yet another method of forming a semiconductor construction. A substrate is provided to have a defined memory array region. The substrate comprises, within the memory array region, a plurality of storage node contacts covered by an insulative material. Trenches are formed within the insulative material. The trenches have faceted upper portions. The facets slope upwardly and outwardly relative to the trenches. Uppermost and outermost faceted edges of adjacent trenches are spaced from one another by intervening regions of the insulative material. The trenches are filled with electrically conductive bitline material. The bitline material extends over the trench faceted portions but not over the intervening regions of the insulative material. The bitline material is utilized as an etch mask during an etch to form first openings extending through the intervening insulative material to the storage node contacts. A filler material is formed within the first openings. After the filler material is formed, the bitline material is recessed within the trenches to form unfilled regions of the trenches above the bitline material. Insulative caps are formed within the unfilled regions of the trenches over the bitline material. After the insulative caps are formed, at least some of the filler material is removed to form second openings extending to the storage node contacts. Electrically conductive material is formed within the second openings and electrically coupled to the storage node contacts.

In one aspect, the invention includes a semiconductor structure. The structure comprises a substrate which includes a plurality of storage node contacts within an insulative material. A plurality of trenches are within the insulative material, with the trenches having faceted top portions. The electrically conductive bitlines extend within the trenches. The bitlines only partially fill the trenches. At least portions of individual bitlines are elevationally above the storage node contacts. The bitlines are a plurality of bitlines, with adjacent bitlines being spaced from one another by intervening locations. Insulative caps are within the trenches and over the bitlines. Electrically conductive columns extend through the insulative material in the intervening locations between the bitlines. The electrically conductive columns are electrically coupled with the storage node contacts. The faceted top portions of the trenches slope outwardly and upwardly from the trenches, and uppermost surfaces of the faceted portions are directly against the electrically conductive columns.

BRIEF DESCRIPTION OF THE DRAWINGS

Preferred embodiments of the invention are described below with reference to the following accompanying drawings.

FIG. 22 is a high-level block diagram of an electronic system according to an exemplary aspect of the present invention.

FIG. 23 is a simplified block diagram of an exemplary memory device according to an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In some aspects the invention can be considered to comprise methods in which a disposable hard mask is utilized in conjunction with a damascene process so that a self-aligned contact etch can be used during local interconnect fabrication. A standard damascene flow can be utilized in conjunction with incorporation of an additional etch to create a flared (i.e., faceted, prograde) top etch profile. Such creates an overhang adjacent damascene-formed trenches. When the trenches are filled with material, the material creates self-aligning spacers on the overhang. The self-aligning spacers can then be used for self-aligned contact etches. At some point in the process, conductive material can be provided within the trenches and etched back to form bitlines. Insulative material can then be provided over the conductive material to provide an insulative surface that can subsequently be utilized to support capacitor constructions, such as, for example, container-capacitor constructions. In some aspects, the containers can be formed with a high-margin process since the bitlines are buried beneath the insulative material prior to fabrication of the capacitors. Particular aspects of the invention can advantageously form self-aligning spacers, and enable the spacers to be formed simultaneously with other process steps.

Particular exemplary aspects of the invention are described with reference to FIGS. 1-23.

Figure 1:
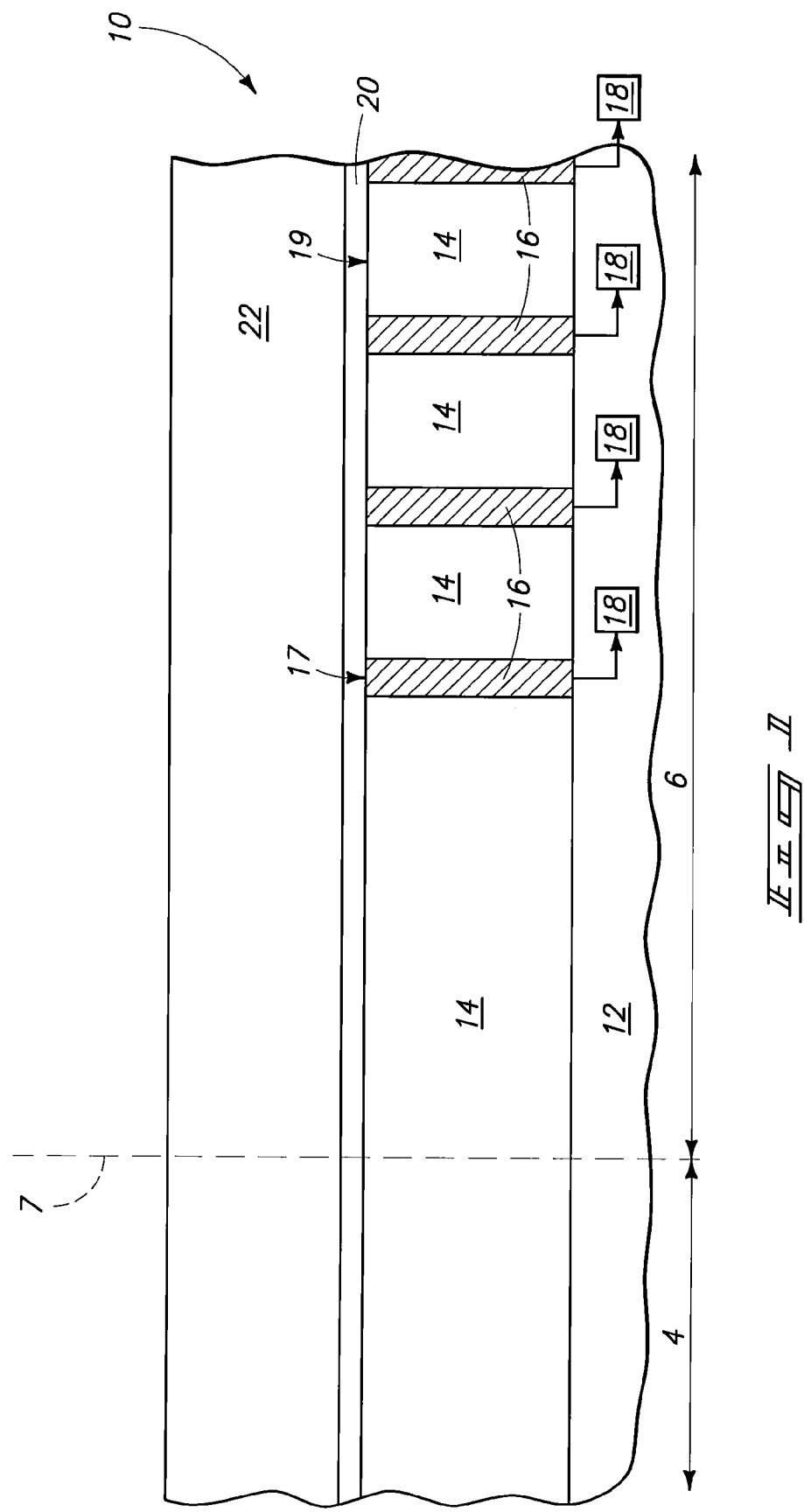
FIG. 1 is a diagrammatic, cross-sectional view of a semiconductor wafer fragment at a preliminary processing stage of an exemplary aspect of an embodiment of the present invention.

Referring initially to FIG. 1, a semiconductor wafer fragment 10 is illustrated at a preliminary processing stage. Wafer fragment 10 comprises a substrate 12. Such substrate can, for example, comprise monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative material 14 is provided over substrate 12, and a plurality of electrically conductive interconnects 16 are within the insulative material. Interconnects 16 can correspond to storage node contacts, and specifically can ultimately be utilized for electrically coupling capacitor storage nodes with other circuitry. The storage node contacts 16 are shown electrically connected to circuitry 18. Such circuitry can correspond to transistor devices associated with wordlines. Specifically, the transistor devices can have source/drain regions which electrically couple with the conductive columns 16, and which ultimately are utilized for passing bits of data to and from capacitors that are also coupled with the columns 16.

Insulative material 14 can comprise any suitable composition or combination of compositions, and in particular aspects will comprise, consist essentially of, or consist of borophosilicate glass.

Electrically conductive columns 16 can comprise any suitable composition or combination of compositions, and in particular aspects will comprise, consist essentially of, or consist of conductively-doped silicon.

Storage node contacts 16 comprise uppermost surfaces 17. Such uppermost surfaces are part of a planarized surface 19 that extends across storage nodes contacts 16 and insulative material 14.

A second insulative material 20 extends over planarized surface 19, and accordingly extends over insulative material 14 and storage node contacts 16. Insulative material 20 can be an etch stop in subsequent processing, and can comprise, consist essentially of, or consist of, for example, silicon nitride or silicon dioxide formed from tetra-ethyl-ortho-silicate (TEOS). In some aspects, insulative materials 14 and 20 can be together considered to be a single insulative material comprising the composition of layer 20 over the composition of layer 14. In such aspects, storage node contacts 16 can be considered to be within the insulative material comprising combined layers 14 and 20, and to have the uppermost surfaces covered by such insulative material.

A third insulative material 22 is over insulative material 20. Insulative material 22 can comprise any suitable composition or combination of compositions, and in particular aspects will comprise, consist essentially of, or consist of borophosphosilicate glass (BPSG) and/or phosphosilicate glass (PSG). Preferably, insulative materials 22 and 20 are of suitable composition relative to one another such that material 22 can be selectively etched relative to material 20.

The construction 10 is shown divided into two defined regions 4 and 6, with a dashed line 7 diagrammatically separating such two defined regions from one another. The defined region 6 can correspond to a memory array region of the construction, and the region 4 can correspond to a region understood to be peripheral to the memory array region. In particular aspects of the invention, DRAM circuitry is formed within the memory array region 6, and peripheral circuitry is formed within the peripheral region 4.

Figure 2:
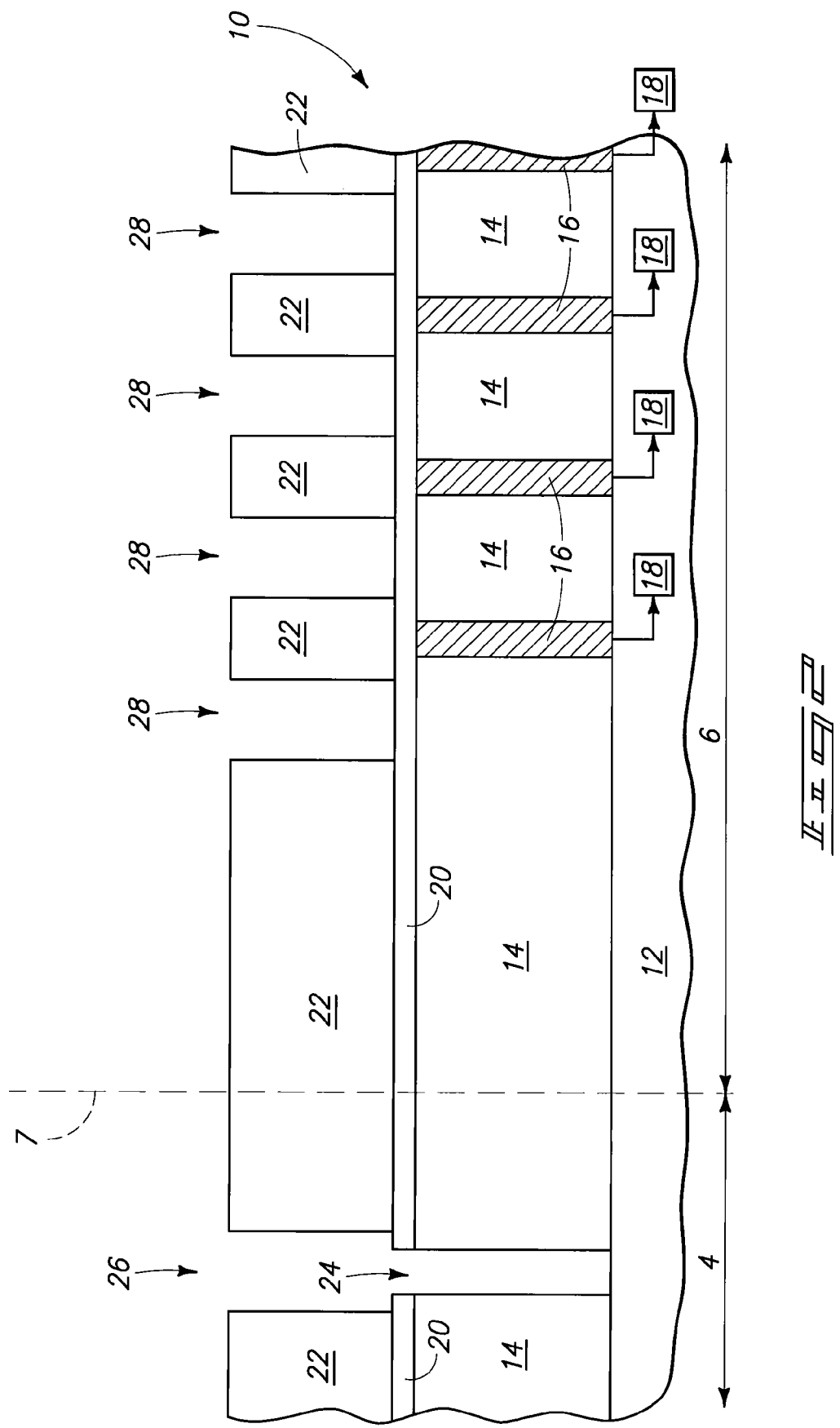
FIG. 2 is a view of the FIG. 1 wafer fragment shown at a processing stage subsequent to that of FIG. 1.

Referring next to FIG. 2, a trench 24 is formed within the peripheral region 4 to extend through insulative materials 14 and 20, and a wider trench 26 is formed over trench 24 to extend through insulative material 22 and to stop on material 20. Additionally, trenches 28 are formed to extend through insulative material 22 in memory array region 6, and to stop on layer 20. Trenches 24, 26 and 28 can be formed utilizing standard damascene processing.

Figure 3:
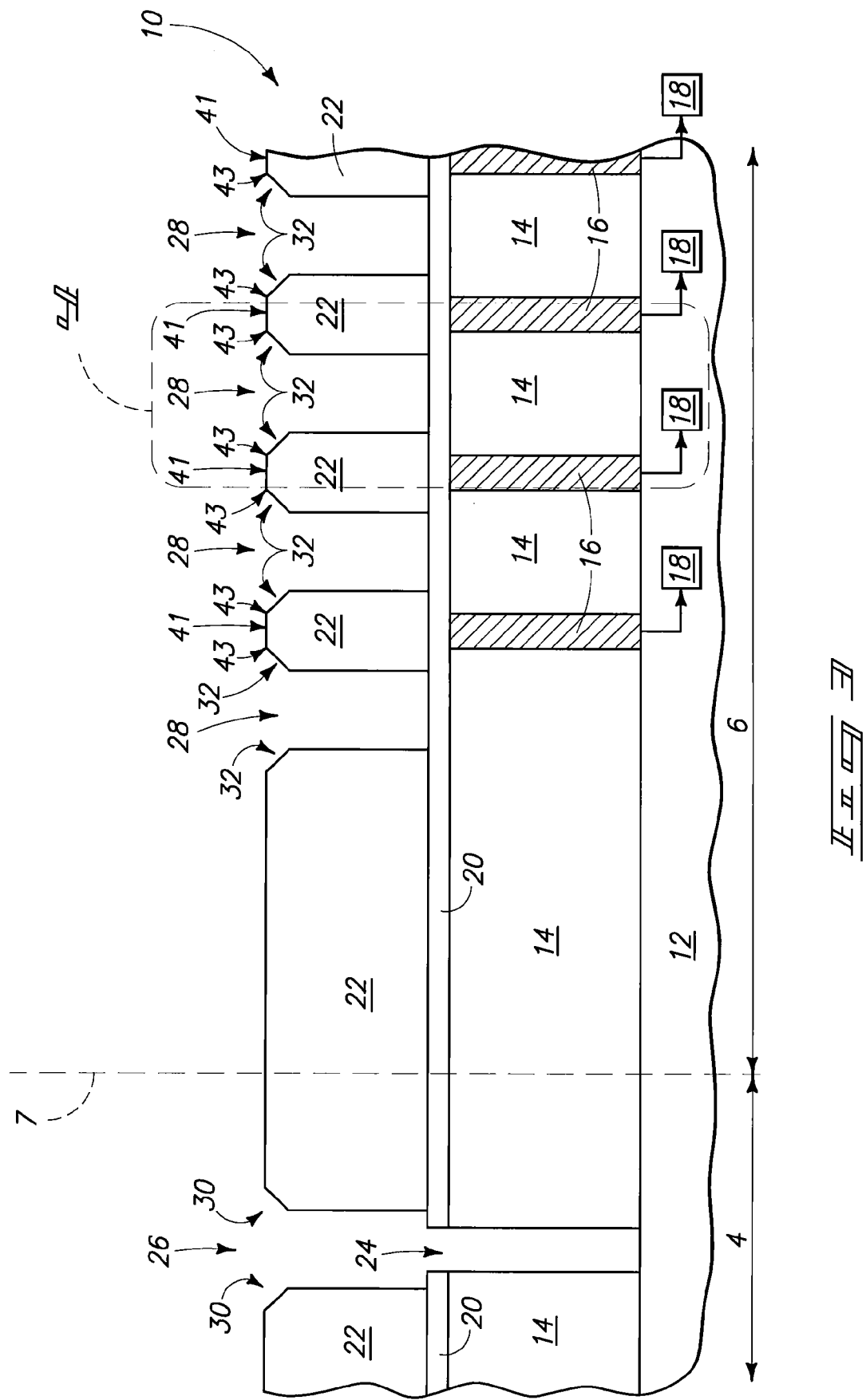
FIG. 3 is a view of the FIG. 1 wafer fragment shown at a processing stage subsequent to that of FIG. 2.

Referring next to FIG. 3, material 22 is subjected to an etch which forms faceted upper portions 30 of trench 26, and faceted upper portions 32 of trenches 28. If material 22 comprises, consists essentially of, or consists of a silicon oxide (such as, for example, BPSG) the facet etch can be accomplished utilizing the following conditions:

argon or fluorine gas at a flow rate of from about 2 standard cubic centimeters per minute (sccm) to about 500 sccm;
$CF_4O$ at a flow rate of from 0 to about 500 sccm;
$CH_2F_2$ at a flow rate of from 0 to about 500 sccm
pressure of from about 1 milliTorr to about 5000 milliTorr; and
power of from about 5 watts to about 5000 watts.

It is to be understood, however, that any suitable chemistry can be utilized for the facet etch. For instance, $O_2$ can be utilized to facet etch a resist, and then standard oxide etch chemistry can be utilized to transfer the facets to underlying oxide. Also, in some aspects an argon presputter can also be utilized to accomplish the facet etch.

Figure 4:
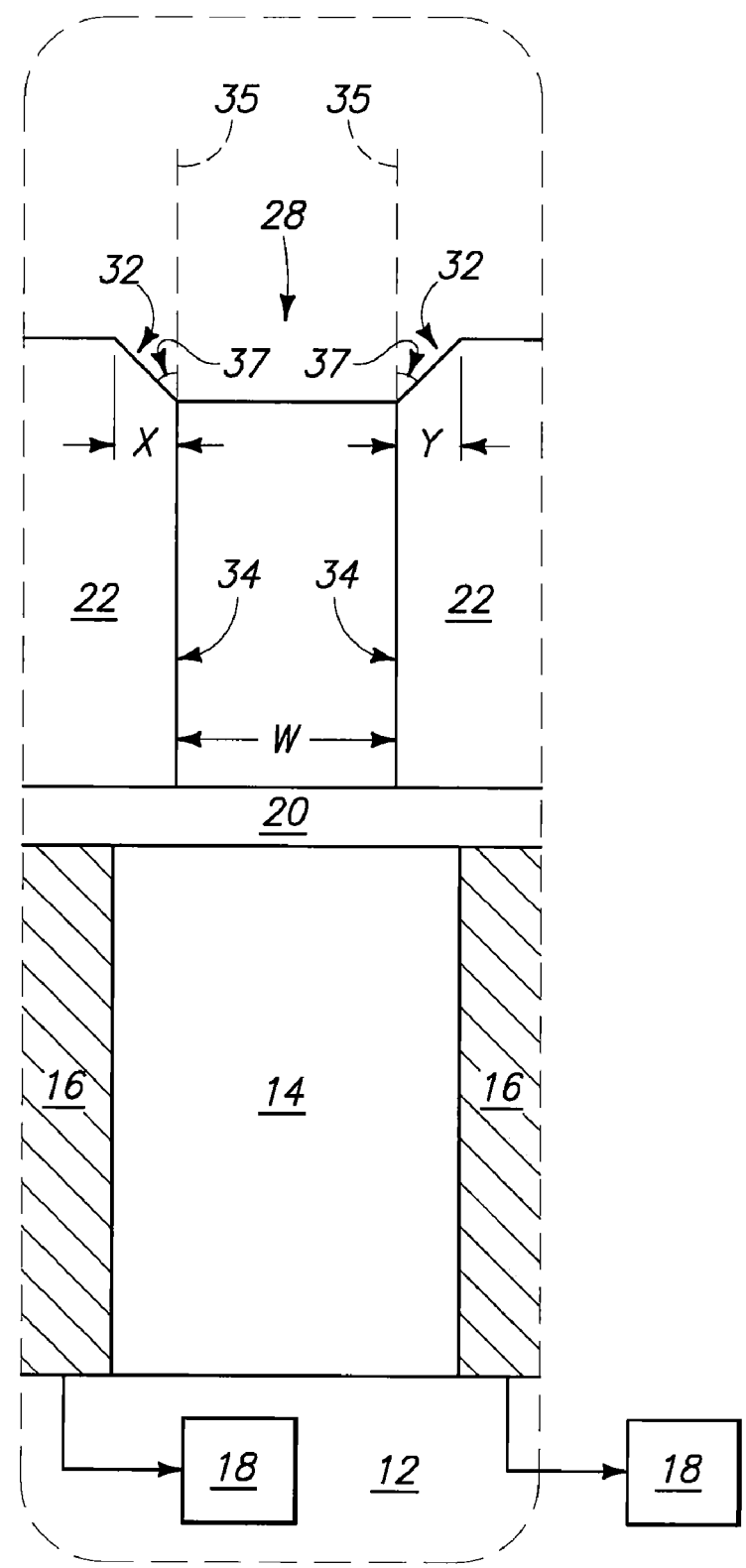
FIG. 4 is an expanded region of the FIG. 3 wafer fragment, with such expanded region being diagrammatically illustrated in FIG. 3 as the region "4".

FIG. 4 shows an expanded region of FIG. 3, and is utilized to illustrate various aspects of facets of exemplary embodiments of the present invention. In the cross-sectional view of FIG. 4, it can be seen that the shown trench 28 has a bottom periphery with a horizontally-extending width "W". Such width can be, for example, at least about 50 Å; in some cases from about 50 Å to about 5000 Å; from about 50 Å to about 1000 Å; or from about 50 Å to about 500 Å. Also in the shown cross-sectional view, the trench has a pair of facets 32 on opposing sides of the trench relative to one another. The facet on the shown left side of the trench has a horizontally-extending width "X", and the facet on the right side of the trench has a horizontally extending width "Y". Dimensions of the horizontally extending widths X and Y can be from about 10% to about 400% of the dimension of horizontally extending width "W", and can be, for example, from about 10% to about 50% of the horizontally-extending width "W", or in particular aspects can be from about 15% to about 25% of the horizontally-extending width "W". In some aspects, each of the widths "X" and "Y" can be from about 50 Å to about 300 Å, and in particular aspects can be from about 100 Å to about 300 Å.

The shown facets can be considered to extend upwardly and outwardly relative to the trench 28 with which the facets are associated. In other words, each of the shown facets can be considered to have a slope which extends upwardly and outwardly relative to a vertical sidewall of the trench with which the facets are associated. The vertical sidewalls are labeled as 34 in the FIG. 4 view. A vertically-extending sidewall can be considered to define a normal axis. Exemplary normal axes are shown extending upwardly beyond the sidewalls, with the extensions of the normal axes being shown in dashed lines and labeled as 35 in the FIG. 4 view. For purposes of interpreting this disclosure and the claims that follow, a faceted portion of a trench is defined as a portion of the trench having a slope angled at from about 10° to about 80° relative to a normal axis defined by a sidewall (specifically, a substantially vertical sidewall) of the trench (with the angles between the facet slopes and the normal axes defined by the sidewalls being designated by the label 37 in FIG. 4), with the facet of the faceted portion being the surface sloped at from about 10° to about 80° relative to the normal axis defined by the sidewall. A typical of a facet angel slope to the normal axis defined by a sidewall will be from about 10° to about 45°. In particular aspects the angle of a facet surface slope to a normal axis defined by a sidewall 34 will be greater than 20° and less than or equal to about 45°; and in some aspects the angle of a facet surface slope to a normal axis defined by a sidewall 34 will be greater than 30° and less than or equal to about 45°.

Referring back to FIG. 3, the insulative material 22 between adjacent trenches of the memory array region 6 forms pillars 40 having uppermost edges 41. The faceted portions have uppermost and outermost edges (or corners) 43, and the uppermost and outermost faceted portion edges 43 of adjacent trenches are spaced from one another by intervening regions of insulative material corresponding to the uppermost surfaces 41 of pillars 40.

Figure 5:
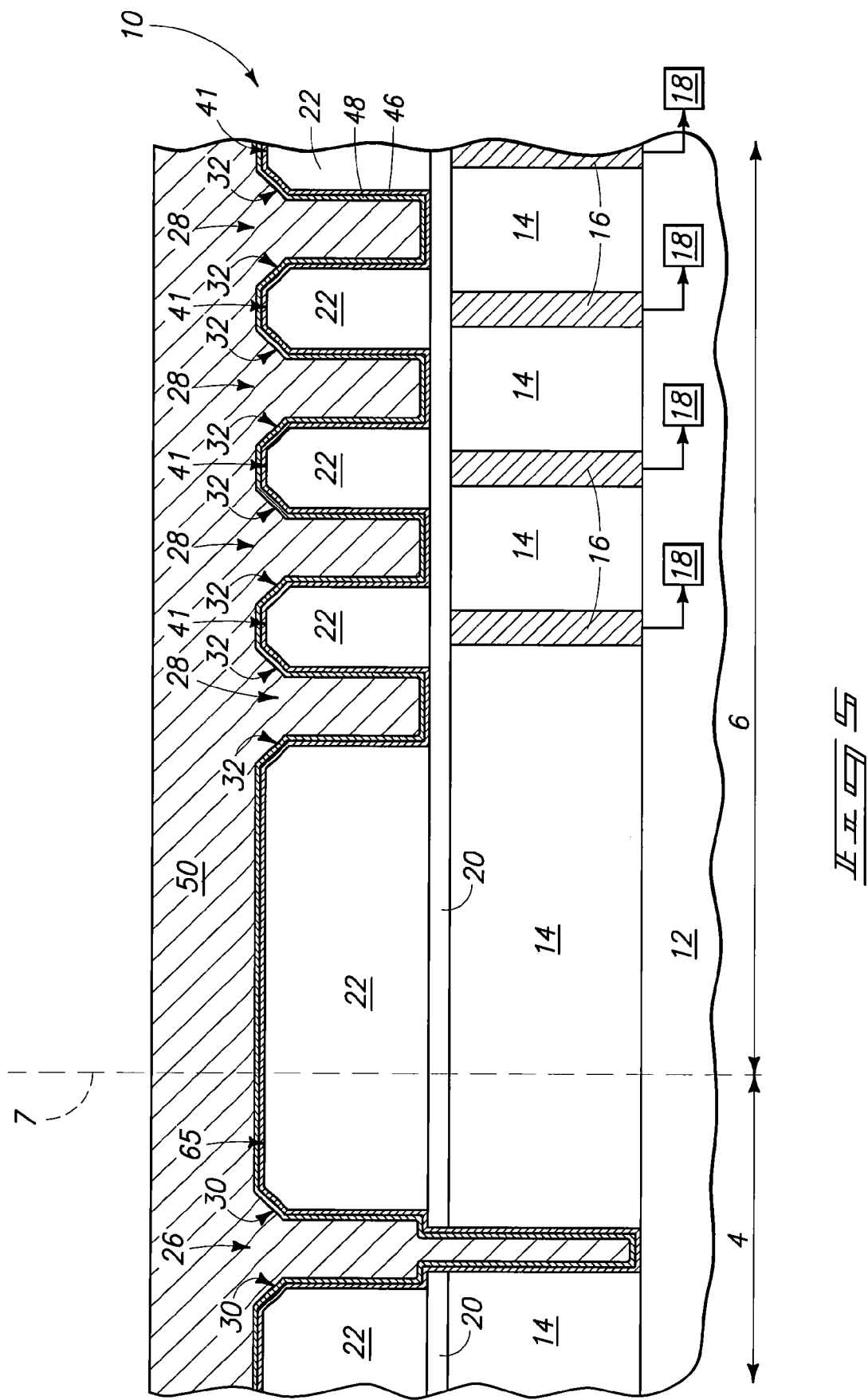
FIG. 5 is a view of the FIG. 1 wafer fragment shown at a processing stage subsequent to that of FIG. 3.

Referring to FIG. 5, electrically conductive material is formed within trenches 26 and 28, over the facets 30 and 32, and over the intervening regions 41 between adjacent faceted portions. The shown conductive material comprises three compositions 46, 48 and 50. Composition 46 can comprise, consist essentially of, or consist of titanium; composition 48 can comprise, consist essentially of, or consist of titanium nitride and/or tungsten nitride; and composition 50 can comprise, consist essentially of, or consist of tungsten. The conductive material of the combined compositions 46, 48 and 50 can be referred to as a material 46/48/50. Such material can be considered a bitline material, in that the material is ultimately patterned into bitlines. Although the bitline material is shown comprising three compositions, it is to be understood that any suitable conductive material can be utilized. For instance, metal silicide (such as, for example, tungsten silicide) can be incorporated into the bitline material in addition to, or alternatively to, one of the stated compositions 46, 48 and 50.

Figure 6:
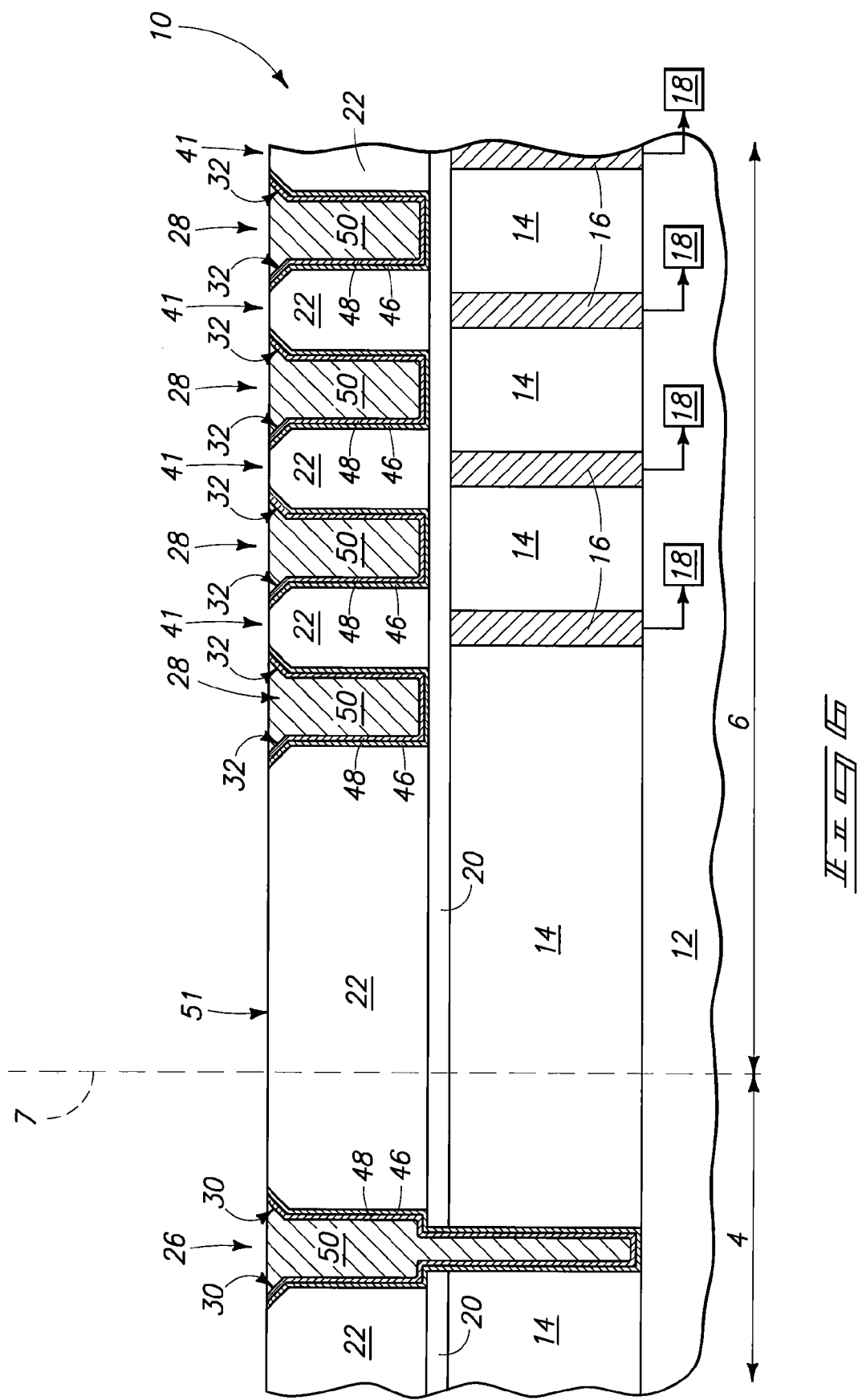
FIG. 6 is a view of the FIG. 1 wafer fragment shown at a processing stage subsequent to that of FIG. 5.

Referring next to FIG. 6, construction 10 is subjected to planarization (such as, for example, chemical-mechanical polishing) to form a planarized upper surface 51 extending across insulative material 22 and across the conductive material 46/48/50. The planarization removes the conductive material from over the intervening regions 41 between the faceted portions while leaving the conductive material within the trenches 26 and 28, and over the faceted portions 30 and 32.

It is noted that the intervening regions 41 are directly over conductive pedestals 16. Accordingly the planarization of the conductive material 46/48/50 has removed the material from directly over storage node contacts 16, while leaving trenches 26 and 28 substantially filled with the conductive material.

The bitline material 46/48/50 at the processing stage of FIG. 6 can be considered to be provided to fill trenches 28, extend over faceted top portions of the trenches, and not extend over the locations 41. In some aspects, locations 41 can be considered node interconnect locations, in that electrically conductive interconnects are ultimately formed to extend through locations 41 and to contact conductive nodes corresponding to conductive columns 16.

It is noted that in the shown aspect of the invention trench 26 has been formed substantially simultaneously with trenches 28 (FIG. 2), and has been filled with conductive material 46/48/50 substantially simultaneously with the filling of trenches 28.

Figure 7:
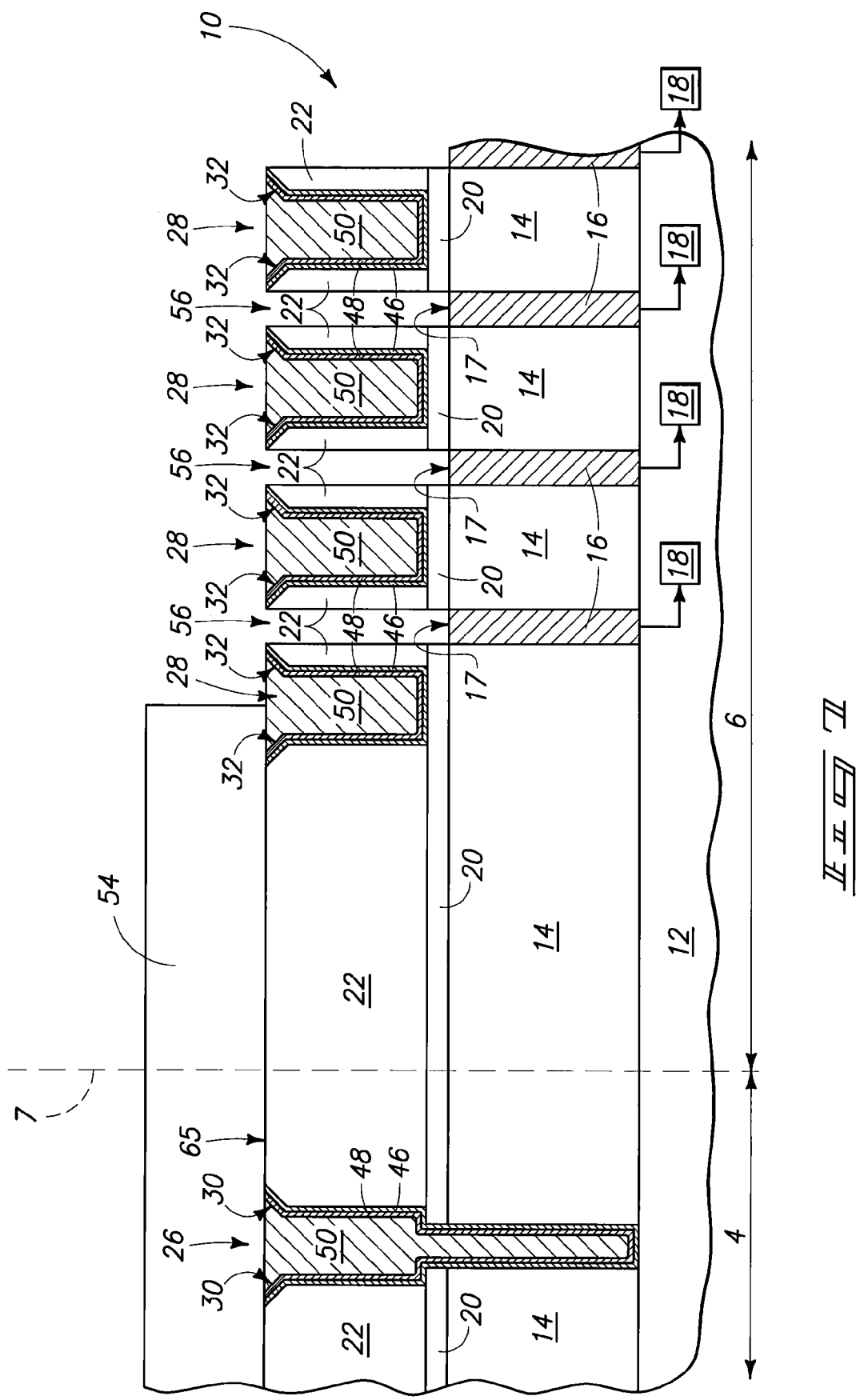
FIG. 7 is a view of the FIG. 1 wafer fragment shown at a processing stage subsequent to that of FIG. 6.

Referring next to FIG. 7, a mask 54 is provided to protect peripheral region 4 of construction 10. Subsequently, conductive material 46/48/50 is utilized as another mask during an etch to form openings 56 extending through the intervening regions 41 (FIG. 6) of insulative material 22, through insulative material 20, and to the uppermost surfaces 17 of storage node contacts 16. The conductive material 46/48/50 extending across faceted regions 32 forms overhangs which act as a hard mask, and accordingly openings 56 can be considered to be self-aligned relative to the bitline material 46/48/50 within trenches 28. It is noted that the self-alignment is in the plane of the shown cross-sectional view of FIG. 7, and that there typically would not be self-alignment orthogonally to such plane, (i.e., in and out of the page of the shown view of FIG. 7). Accordingly, additional masking (not shown) would be utilized to accomplish desired alignments orthogonally to the plane of the view of FIG. 7.

Figure 8:
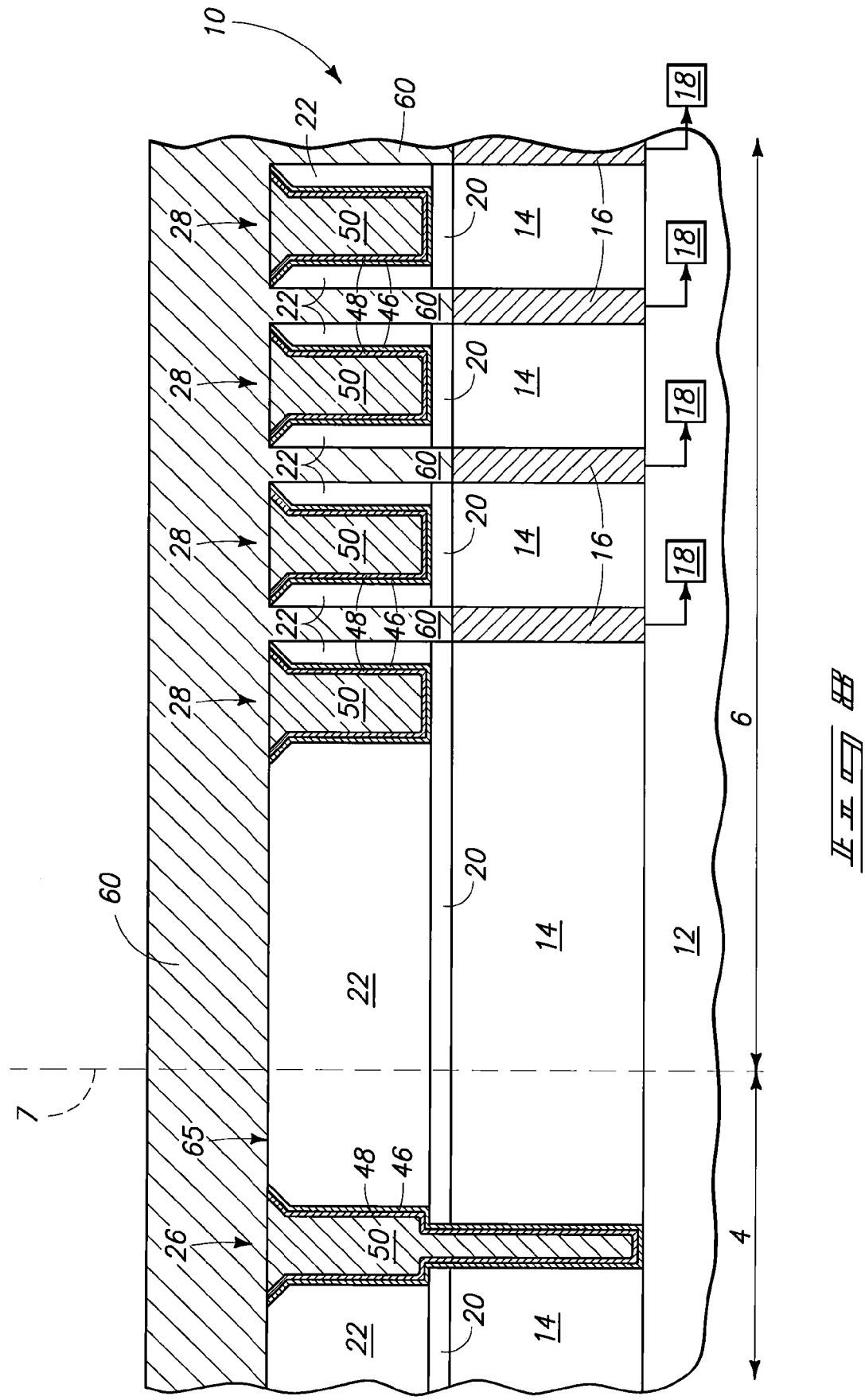
FIG. 8 is a view of the FIG. 1 wafer fragment shown at a processing stage subsequent to that of FIG. 7.

Referring next to FIG. 8, mask 54 (FIG. 7) is removed. Subsequently, a conductive material 60 is formed to extend over bitline material 46/48/50 and insulative material 22, and to extend within openings 56 to physically contact the uppermost surfaces of storage node contacts 16. Material 60 can comprise any suitable conductive composition or combination of compositions, and in particular aspects will comprise conductively-doped silicon. The silicon can be conductively-doped as deposited, or can be deposited in a substantially undoped form and subsequently doped by any suitable methodologies, (such as, for example, implanting).

Figure 9:
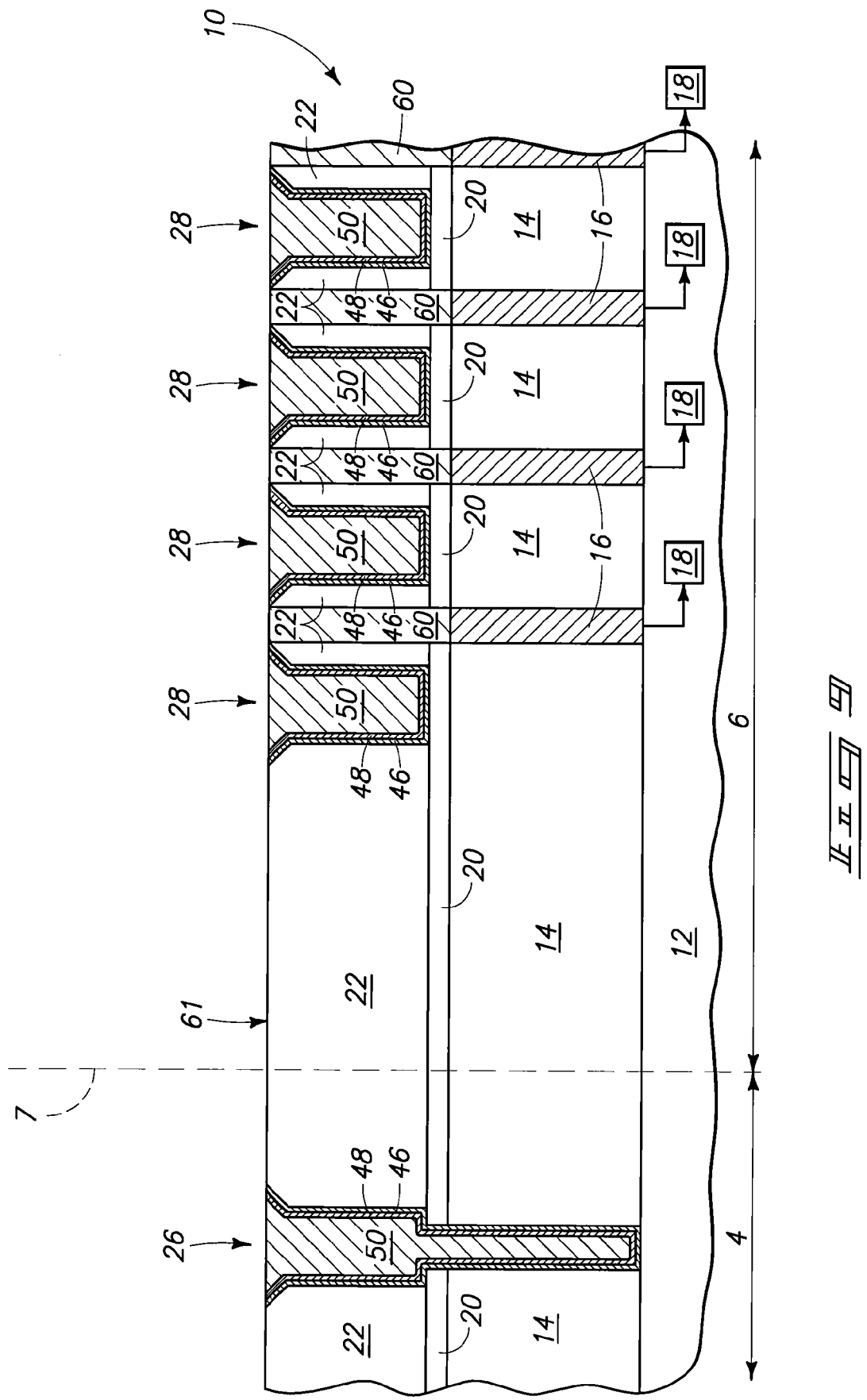
FIG. 9 is a view of the FIG. 1 wafer fragment shown at a processing stage subsequent to that of FIG. 8.

Referring next to FIG. 9, material 60 is subjected to planarization (such as, for example, chemical-mechanical polishing) to remove material 60 from over bitline material 46/48/50 and insulative material 22. Such leaves material 60 within intervening regions between trenches 28 as electrically conductive interconnects. The interconnects extend from direct physical contact with storage node contacts 16 to a planarized uppermost surface 61 extending across construction 10. The interconnects can be considered to be electrically conductive columns or structures between trenches 28.

Figure 10:
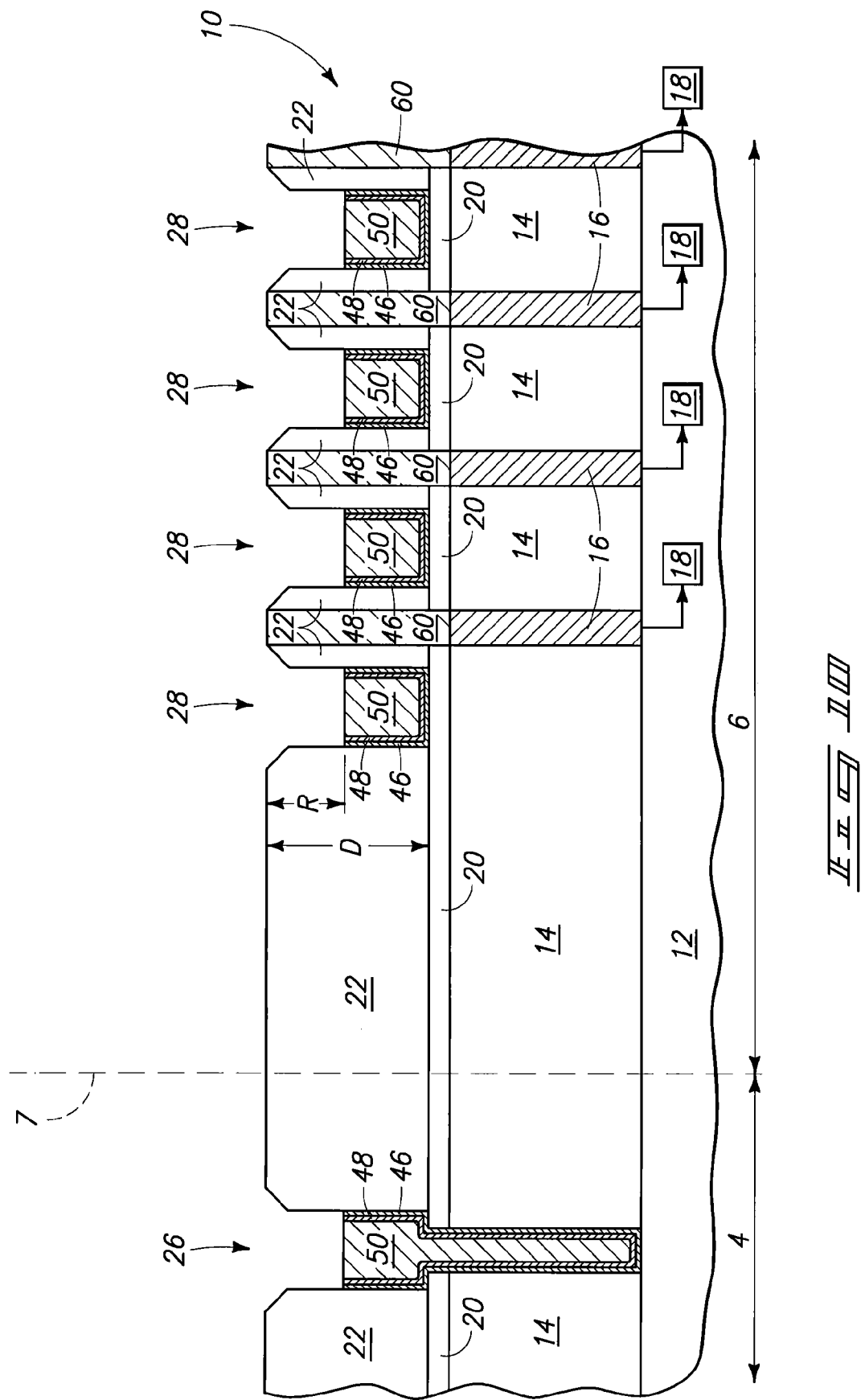
FIG. 10 is a view of the FIG. 1 wafer fragment shown at a processing stage subsequent to that of FIG. 9.

Referring next to FIG. 10, bitline material 46/48/50 is recessed within trenches 26 and 28. Such can be accomplished with an etch selective for materials 46/48/50 relative to materials 22 and 60, and/or by providing a patterned mask (not shown) to protect materials 22 and 60 during the etch of bitline material 46/48/50. In exemplary aspects, the etch of bitline material 46/48/50 will utilize an ammonium peroxide mixture (which is generally selective for metals relative to oxides of silicon) and/or a dry etch.

The reduction in height of bitline material 46/48/50 forms openings in the trenches 26 and 28 above the remaining bitline material, and patterns bitlines within trenches 28 from the remaining material 46/48150. Trenches 28 can be initially formed to a total depth "D" of from about 1000 Å to about 6000 Å, and the remaining depth "R" after reduction of the height of bitline material 46/48/50 can be from about 5000 Å to about 3000 Å. The remaining depth "R" is typically from about 750 Å to about 1250 Å, with a common dimension being about 1000 Å.

Figure 11:
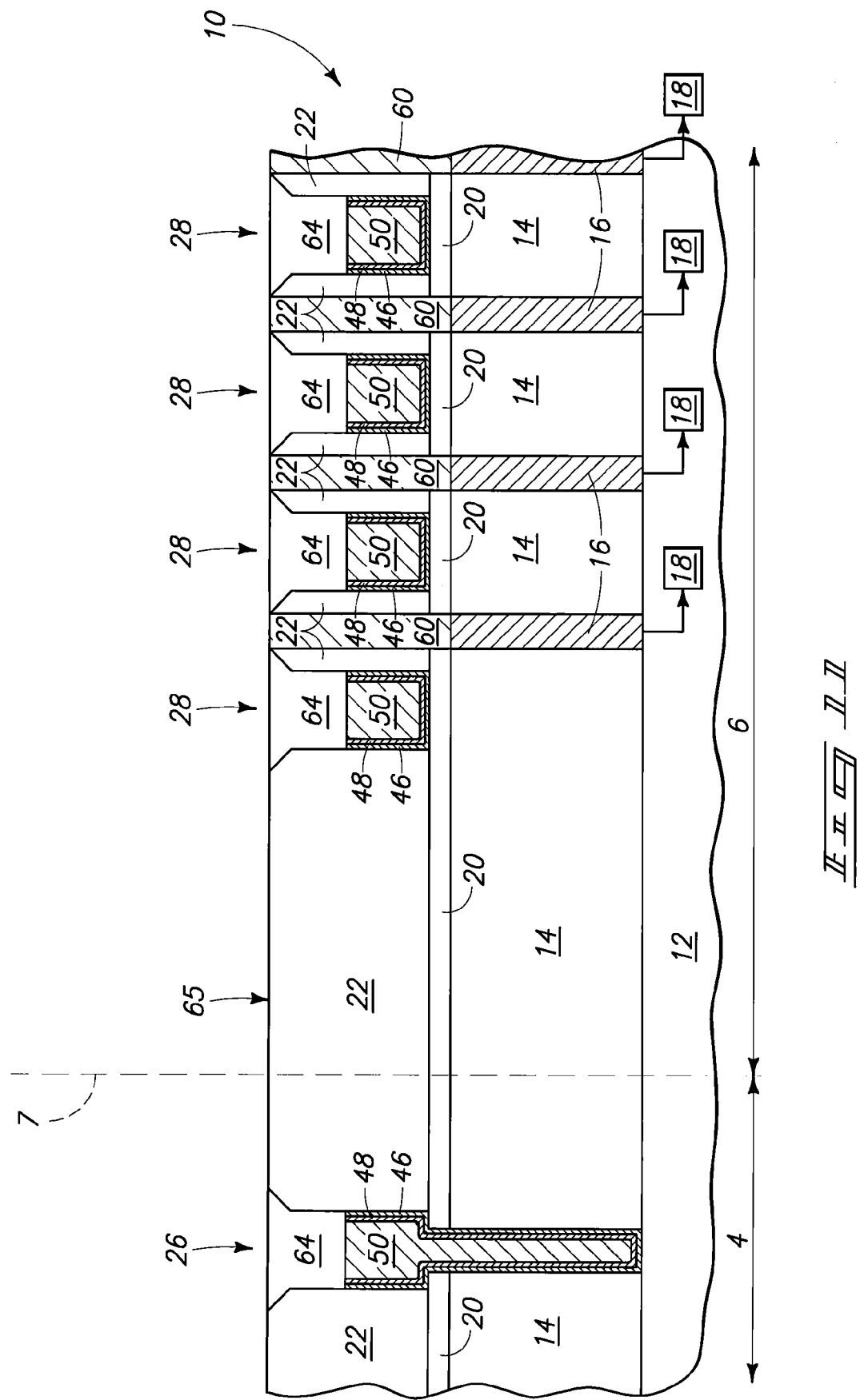
FIG. 11 is a view of the FIG. 1 wafer fragment shown at a processing stage subsequent to that of FIG. 10.

Referring next to FIG. 11, insulative caps 64 are formed within openings 26 and 28, and over the recessed bitline material 46/48/50. Such caps can be formed by providing an insulative material over material 22 and within openings 26 and 28, and subsequently subjecting the material to planarization to form the shown planarized upper surface 65 extending across material 22 and material 64. Insulative material 64 can comprise any suitable composition or combination of compositions, and in particular aspects will comprise, consist essentially of, or consist of silicon nitride.

Figure 12:
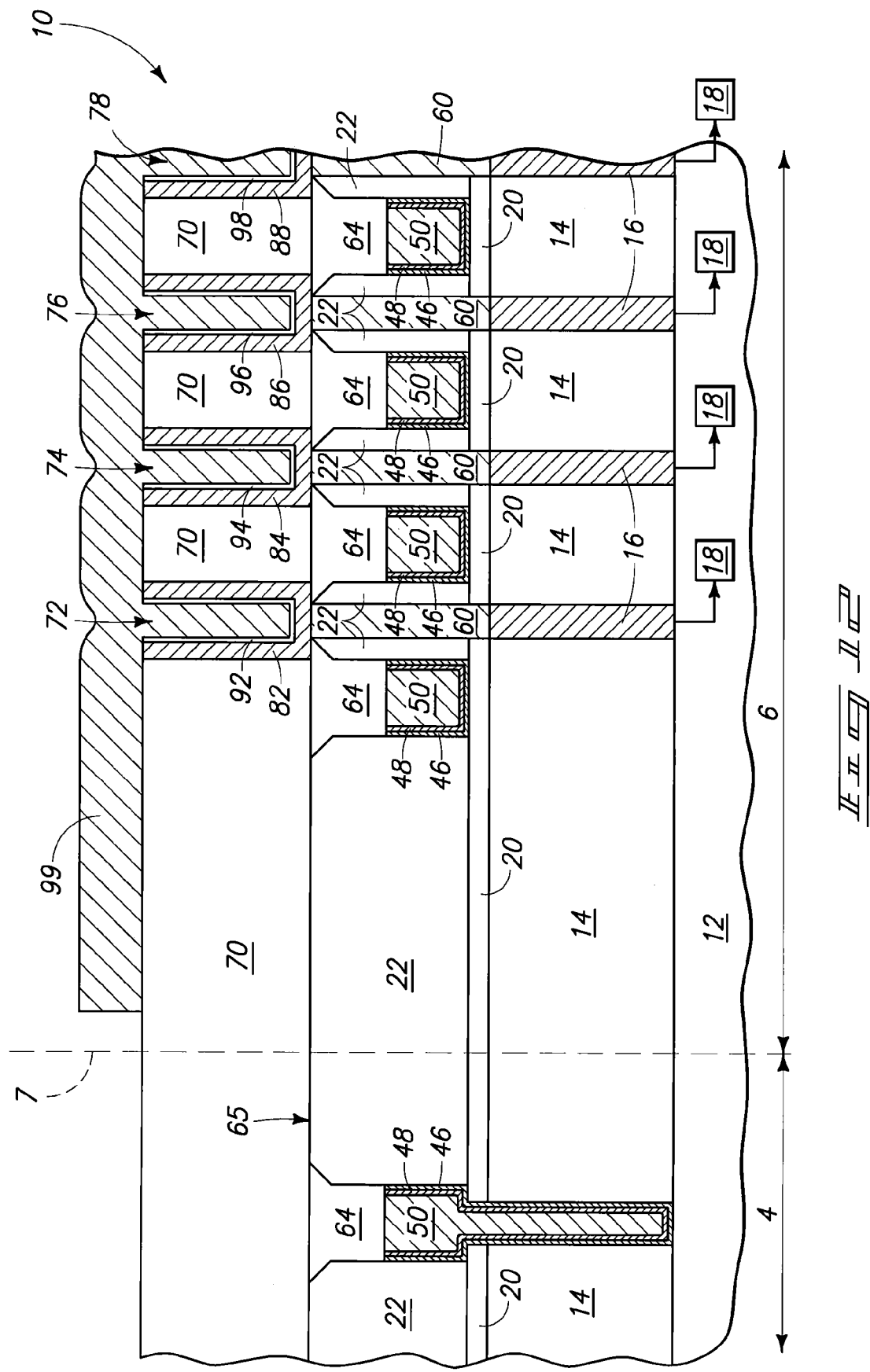
FIG. 12 is a view of the FIG. 1 wafer fragment shown at a processing stage subsequent to that of FIG. 11.

Referring next to FIG. 12, an insulative material 70 is formed over planarized surface 65, and subsequently capacitor structures 72, 74, 76 and 78 are formed within the insulative material. Each of the capacitor structures comprises a first electrode (82, 84, 86 and 88), a dielectric material (92, 94, 96 and 98) and a second electrode (99). The first electrodes 82, 84, 86 and 88 will be recognized by persons of ordinary skill in the art as being storage nodes. Accordingly, the conductive columns of material 60 connect storage nodes of capacitors 72, 74, 76 and 78 with the storage node contacts 16, and ultimately with the circuitry 18. As discussed previously, circuitry 18 can comprise transistor devices, and accordingly the construction of FIG. 12 can comprise capacitor constructions electrically coupled with transistor devices through the interconnecting storage node contacts 16 and conductive material 60. As will be recognized by persons of ordinary skill in the art, a capacitor coupled to a transistor device is a unit cell of a DRAM. Accordingly, the construction of FIG. 12 can comprise a plurality of DRAM unit cells associated with memory region 6. Each of the capacitors 72, 74, 76 and 78 is in one-to-one correspondence with a conductive column of material 60. The capacitors are shown as container-type capacitors, but it is to be understood that any suitable capacitor type can be utilized.

FIGS. 1-12 illustrate one aspect in which faceted portions associated with trenches are utilized during fabrication of bitlines and conductive pedestals between the bitlines. Another exemplary aspect is described with reference to FIGS. 13-19.

Figure 13:
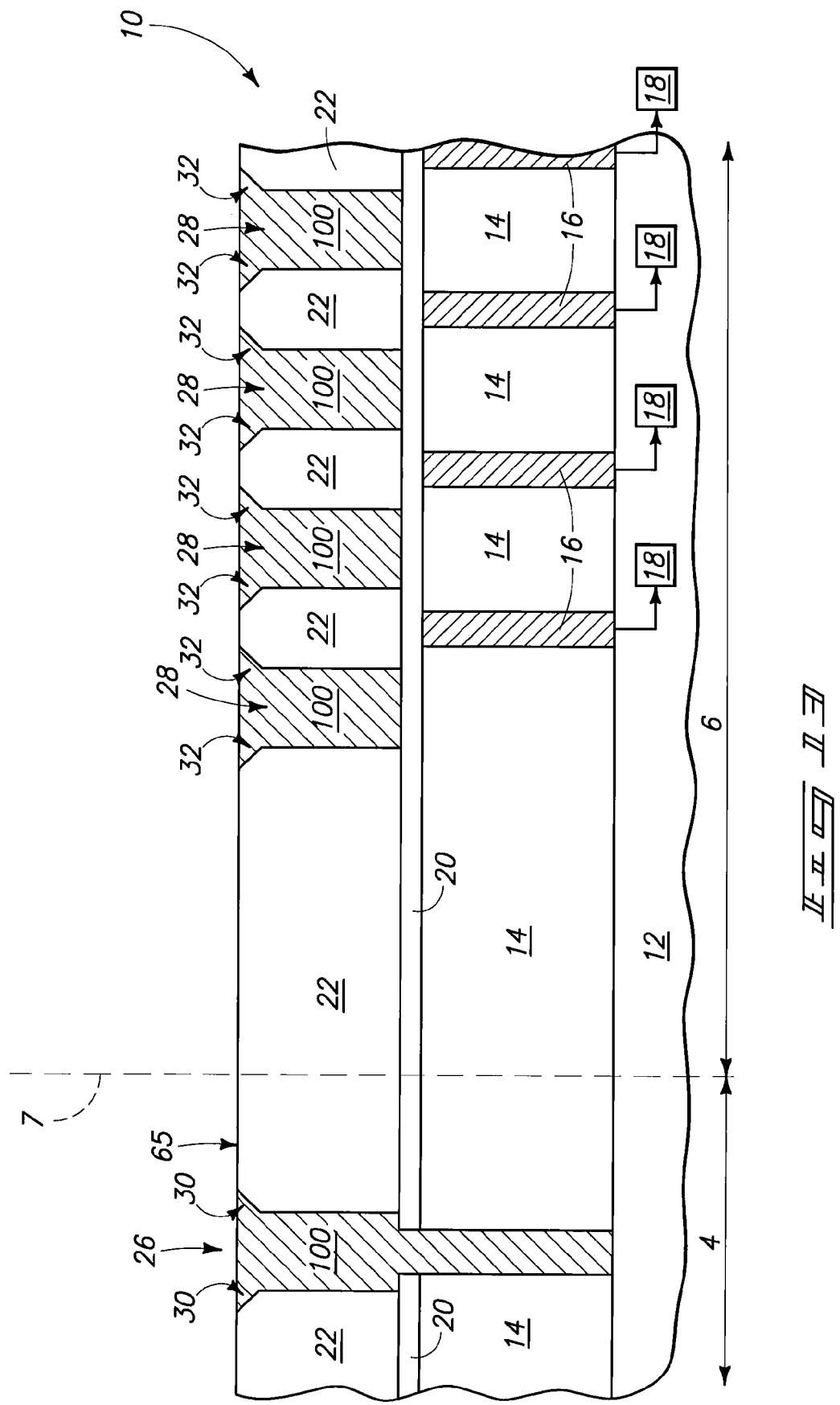
FIG. 13 is a diagrammatic, cross-sectional view of the FIG. 1 wafer fragment shown at a processing stage identical to that of FIG. 6, and is a starting point for discussion of a second embodiment aspect of the present invention.

Referring initially to FIG. 13, construction 10 is illustrated at a processing stage identical to that of the above-discussed FIG. 6. The construction 10 of FIG. 13 is, however, shown comprising a conductive material 100 in place of material 46/48/50 of FIG. 6. Such change in provided for convenience, and it is to be understood that the material 100 of FIG. 13 can, and typically would, comprise the material 46/48/50 discussed above with reference to FIG. 6.

Figure 14:
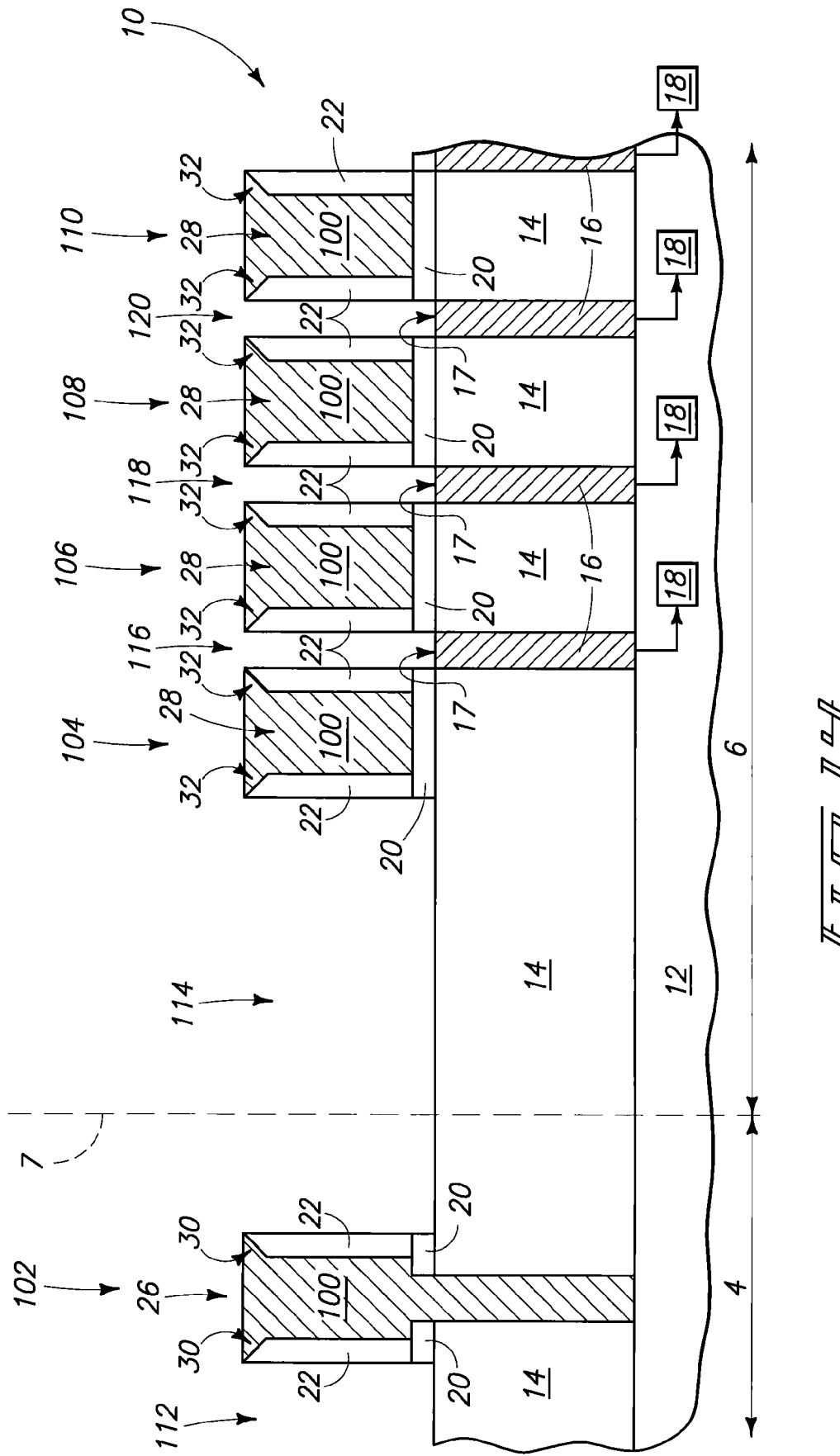
FIG. 14 is a view of the FIG. 13 wafer fragment shown at a processing stage subsequent to that of FIG. 13.

Referring next to FIG. 14, material 100 has been utilized as a mask during an etch of materials 20 and 22. A suitable etch is an anisotropic oxide/nitride dry etch, with material 100 comprising tungsten and functioning as a hard mask. The etch forms self-aligned spacers from the material 22 remaining against material 100 and under the faceted portions 30 and 32. The alignment of the spacers formed from material 22 relative to material 100 is within the plane of the cross-sectional view of FIG. 14. It is noted that some self-alignment can also occur in directions orthogonal to the shown cross-sectional view (i.e., directions in and out of the page relative to the shown cross-sectional view).

The etch of materials 20 and 22 forms pedestals 102, 104, 106, 108 and 110 comprising conductive material 100 and adjacent material 22 spacers. The etch also forms openings 112 and 114 adjacent the pedestal 102 associated with peripheral region 4; and forms openings 116, 118 and 120 between the pedestals 104, 106, 108 and 110 associated with the memory array region 6 of the substrate. The openings 116, 118 and 120 extend down to upper surfaces 17 of storage node contacts 16.

Figure 15:
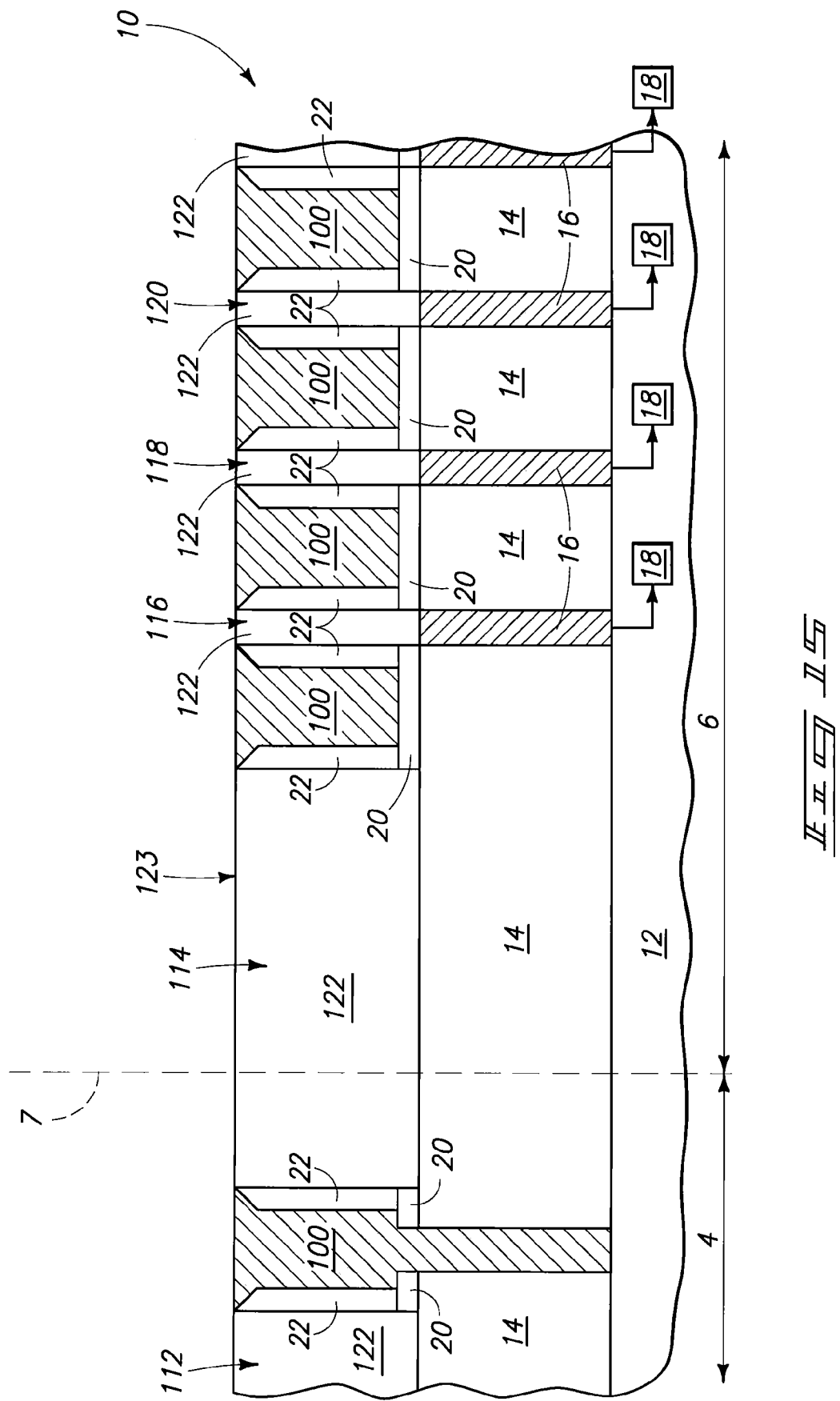
FIG. 15 is a view of the FIG. 13 wafer fragment shown at a processing stage subsequent to that of FIG. 14.

Referring next to FIG. 15, an electrically insulative material 122 is provided within the openings 112, 114, 116, 118 and 120. Insulative material 122 can comprise, consist essentially of, or consist of, for example, a spin-on dielectric and/or silicon dioxide which has not been spun-on.

Construction 10 is shown having a planarized upper surface 123 at the processing stage of FIG. 15. Such can be accomplished by forming insulative material 122 to extend over material 100 and within the openings 112, 114, 116, 118 and 120, and subsequently subjecting construction 10 to planarization (such as, for example, chemical-mechanical polishing) to form the planarized upper surface.

Figure 16:
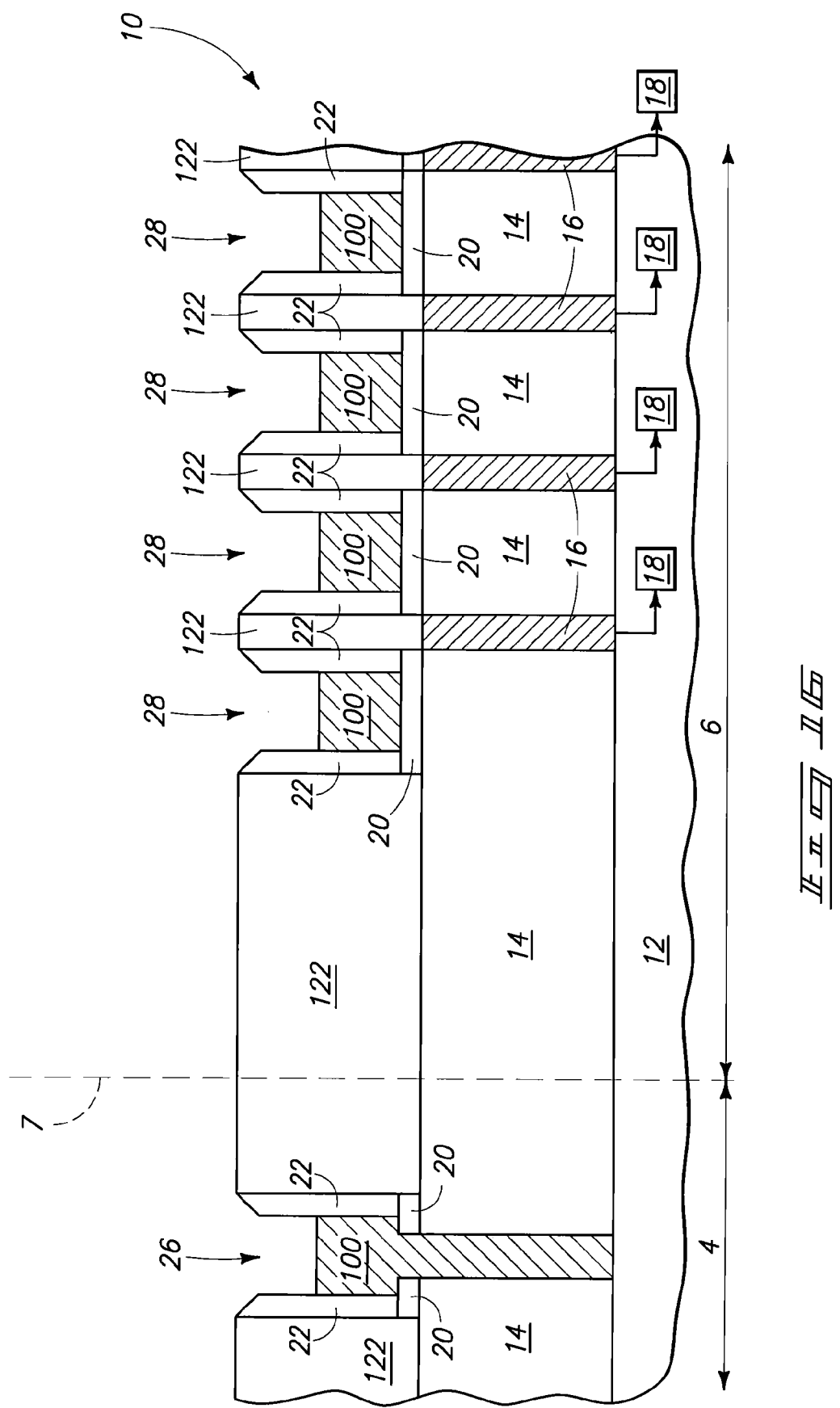
FIG. 16 is a view of the FIG. 13 wafer fragment shown at a processing stage subsequent to that of FIG. 15.

Referring next to FIG. 16, conductive material 100 is subjected to an etch which reduces the height of the conductive material within trenches 26 and 28, and which accordingly reopens portions of trenches 26 and 28 above the remaining portion of conductive material 100. The etch of conductive material 100 can be identical to an etch of material 46/48/50 discussed above with reference to FIG. 10. In particular aspects, material 100 will predominately comprise tungsten, and the etch can comprise a tungsten etch-back of the conductive material.

Figure 17:
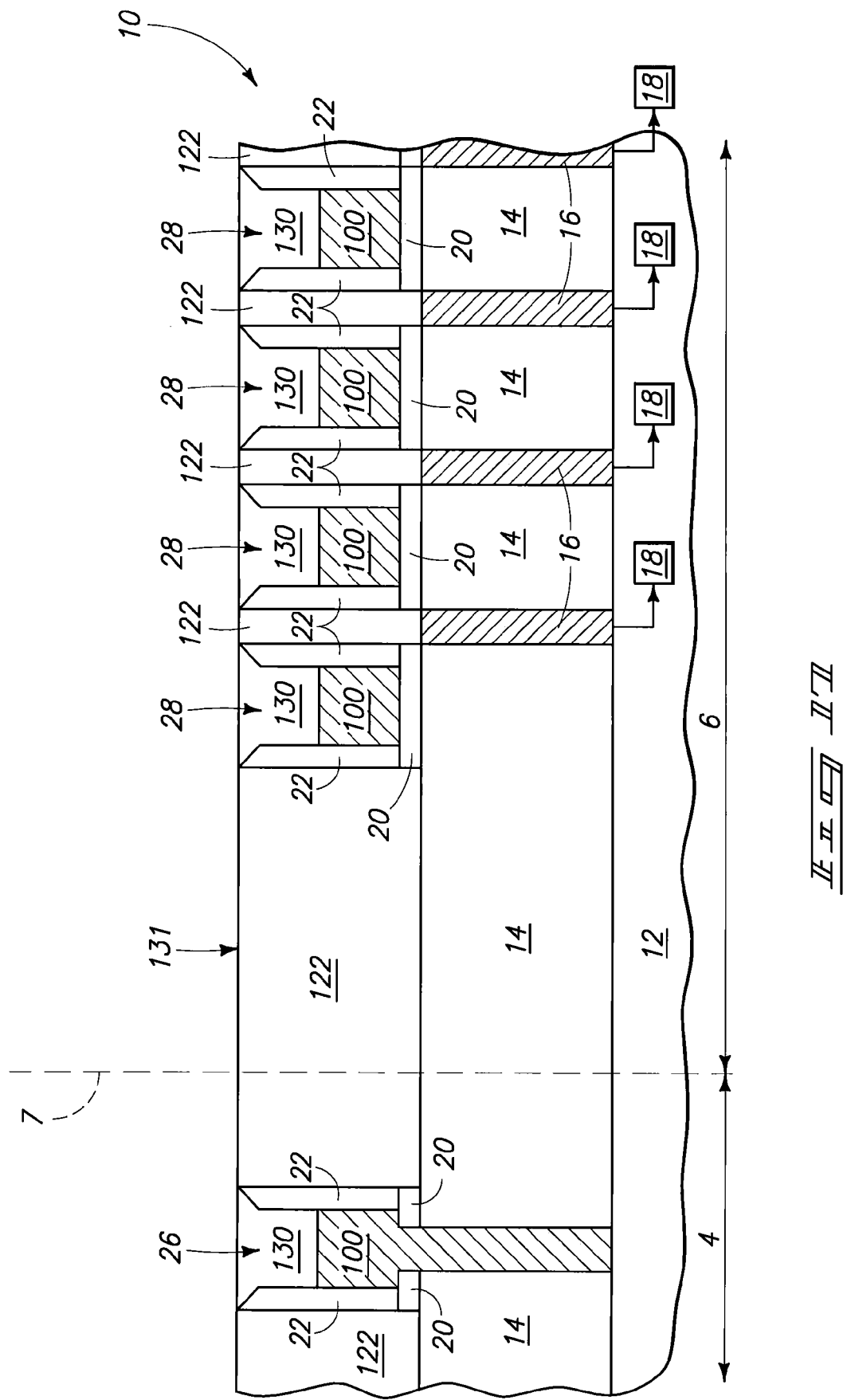
FIG. 17 is a view of the FIG. 13 wafer fragment shown at a processing stage subsequent to that of FIG. 16.

Referring next to FIG. 17, an insulative material 130 is provided to fill the portions of trenches 26 and 28 over recessed material 100. Insulative material 130 can comprise, consist essentially of, or consist of, for example, silicon nitride. In the shown aspect of the invention, construction 10 comprises a planarized upper surface 131 at the processing stage of FIG. 17. Such can be formed by initially providing material 130 to be over insulative material 122 as well as within the openings 26 and 28, and subsequently planarizing the material 130 to form the planarized upper surface.

Figure 18:
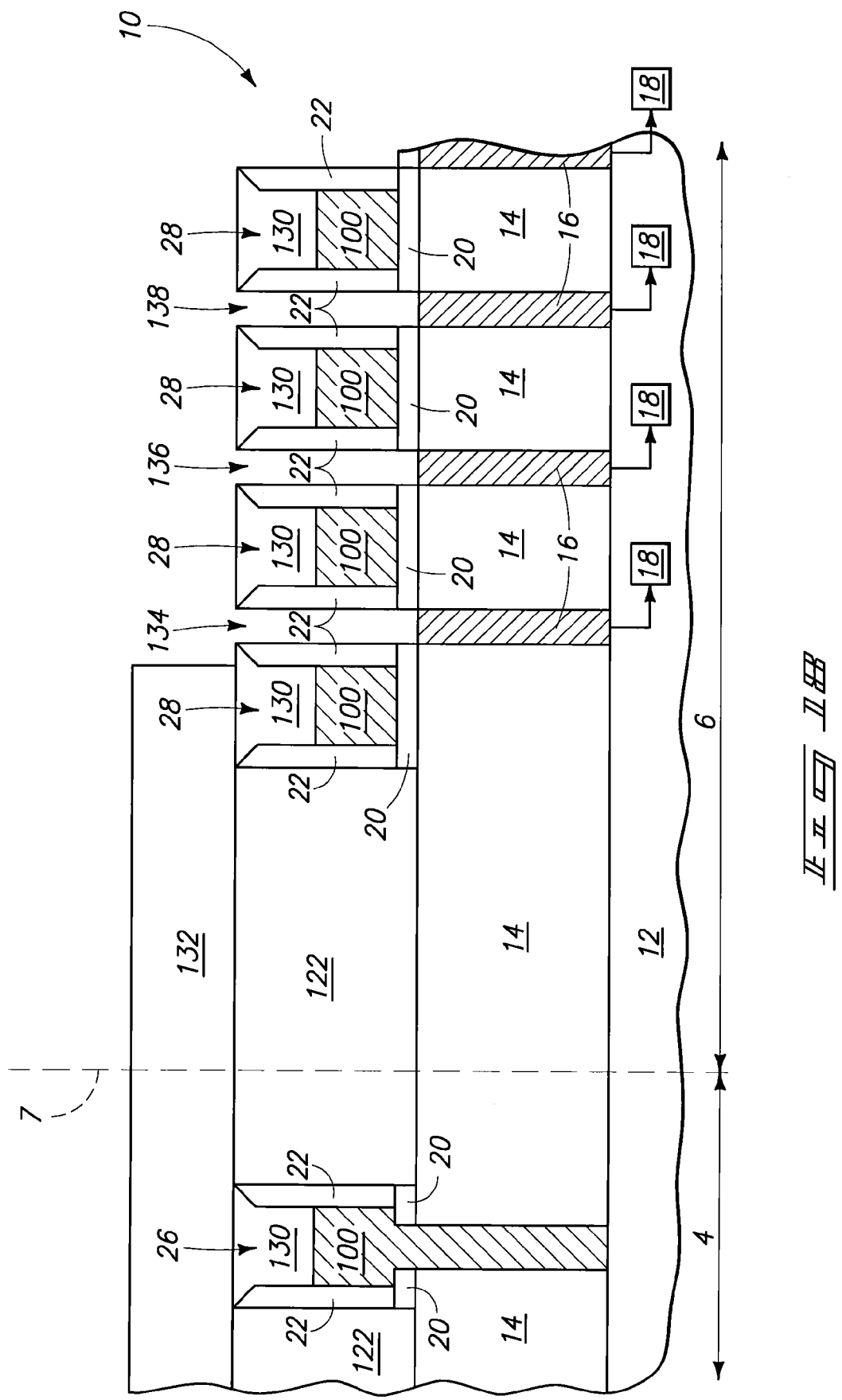
FIG. 18 is a view of the FIG. 13 wafer fragment shown at a processing stage subsequent to that of FIG. 17.

Referring next to FIG. 18, a mask 132 is formed to protect peripheral region 4 during an etch over memory array region 6. Such etch selectively removes the material 122 relative to material 130, and thus forms openings 134, 136 and 138 extending to storage node contacts 16. In exemplary aspects of the invention, material 122 consists essentially of silicon dioxide and material 130 consists essentially of silicon nitride, and accordingly the selective etch utilized to form openings 134, 136 and 138 is an etch selective for silicon dioxide relative to silicon nitride.

Figure 19:
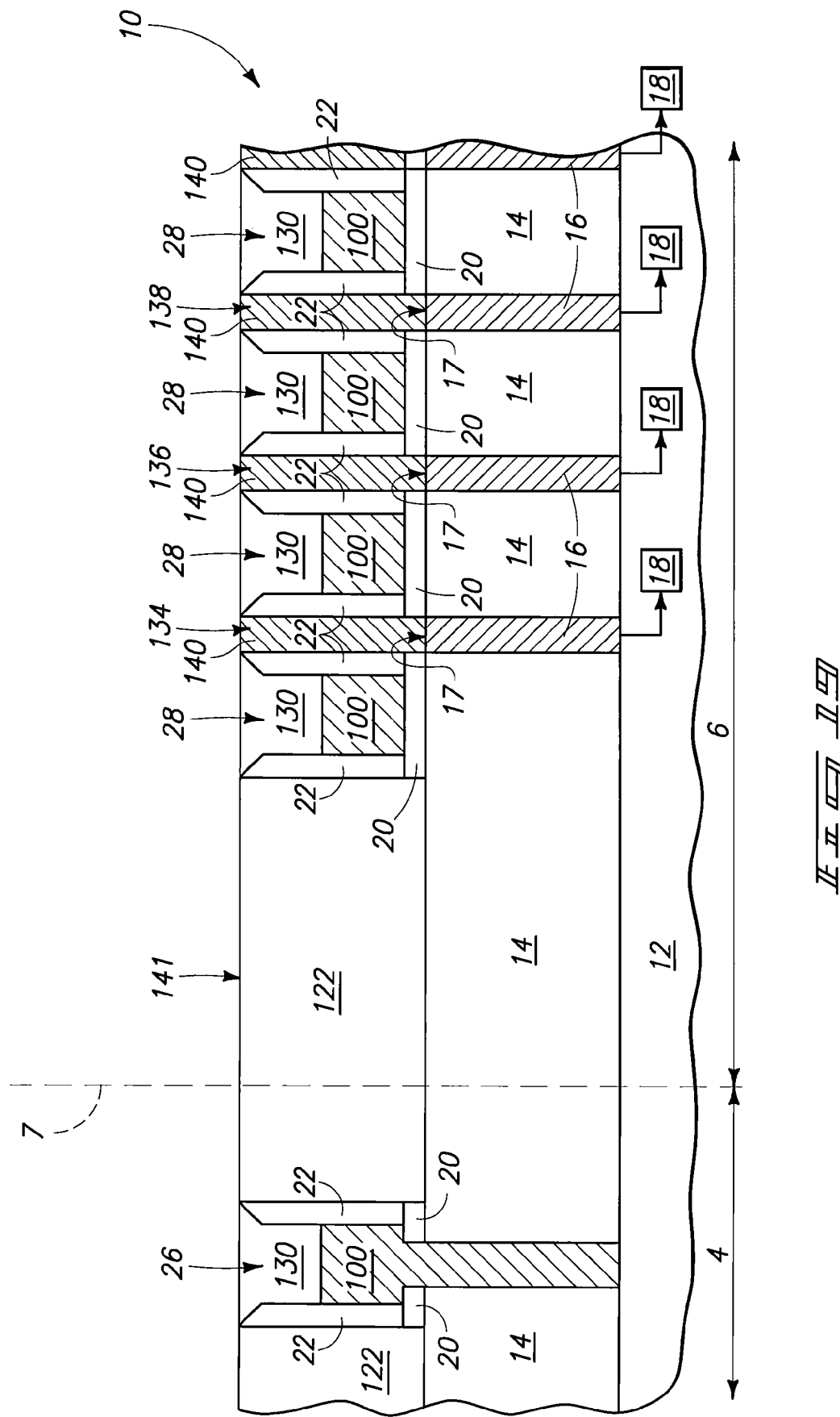
FIG. 19 is a view of the FIG. 13 wafer fragment shown at a processing stage subsequent to that of FIG. 18.

Referring next to FIG. 19, mask 132 (FIG. 18) is removed and conductive material 140 is formed within the openings 134, 136 and 138. Conductive material 140 can comprise any suitable material, and in particular aspects will comprise, consist essentially of, or consist of metals, metal compositions and/or conductively-doped silicon. In the shown aspect of the invention, construction 10 comprises a planarized upper surface 141. Such can be accomplished by initially forming material 140 to cover materials 130 and 122, as well as extending within openings 134, 136 and 138, and then subjecting construction 10 to planarization to form the planarized upper surface extending across materials 122, 130 and 140. In subsequent processing (not shown) capacitors analogous to the capacitors of FIG. 12 can be formed on surface 141.

An advantage of the embodiment of FIGS. 13-19 relative to that of FIGS. 1-12 is that it can be easier to utilize a wider variety of conductive materials for material 140 of FIG. 19 than for the material 60 of FIG. 8. Such advantage occurs because the processing of FIGS. 1-12 utilizes an etch at the processing stage of FIG. 10 which is preferably selective for the metal-containing bitline material 46/48/50 relative to the conductive material 60, whereas the conductive material 140 is formed after the etch of the bitline material 100. Accordingly, the embodiment of FIGS. 12-19 eliminates dependence on the selectivity for etching conductive material 100 relative to material 140.

Figure 20:
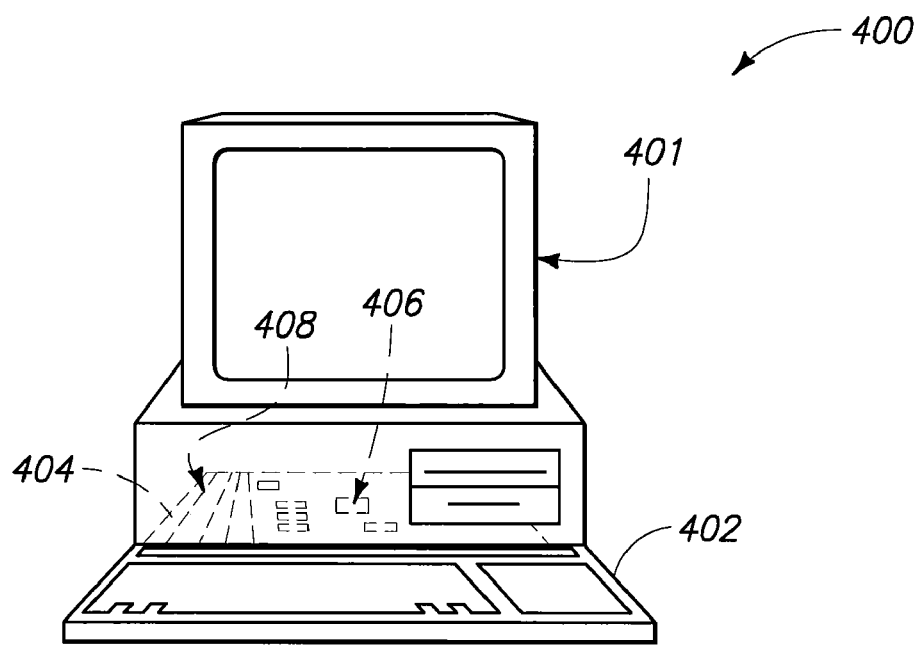
FIG. 20 is a diagrammatic view of a computer illustrating an exemplary application of the present invention.
Figure 21:
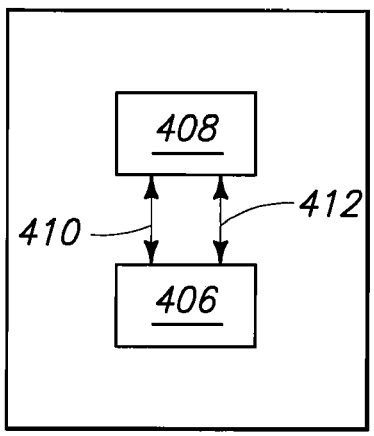
FIG. 21 is a block diagram showing particular features of the motherboard of the FIG. 20 computer.

FIG. 20 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 21. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

FIG. 22 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

FIG. 23 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, comprising:
   forming an electrically insulative material over a semiconductor substrate;
   forming trenches within the electrically insulative material; the trenches having faceted upper portions with facets of the faceted portions sloping upwardly and outwardly relative to interior regions of the trenches; the faceted upper portions having uppermost and outermost facet edges; the uppermost and outermost facet edges of adjacent trenches being spaced from one another by intervening regions of the electrically insulative material;
   forming first electrically conductive material to be within the trenches and over the faceted upper portions, but to not be over the intervening regions of the electrically insulative material;
   using the first electrically conductive material as a mask during an etch through the intervening regions of the electrically insulative material; the etch through the intervening regions forming openings; and
   forming second electrically conductive material to be within the openings.

2. The method of claim 1 wherein the first electrically conductive material is etched selectively relative to the second electrically conductive material to recess the first electrically conductive material.

3. The method of claim 1 wherein, prior to forming the second electrically conductive material, a filler material is formed within the openings and subsequently removed from within the openings.

4. The method of claim 3 wherein, prior to the removal of the filler material, the first electrically conductive material is etched selectively relative to the filler material to recess the first electrically conductive material.

5. A method of forming a semiconductor construction, comprising:
   forming an electrically insulative material over a semiconductor substrate;
   forming trenches within the electrically insulative material;
   forming electrically conductive bitline material to fill the trenches, the electrically conductive bitline material within adjacent trenches being spaced apart by intervening regions of the electrically insulative material;
   patterning the electrically conductive bitline material into bitlines which only partially fill the trenches;
   forming electrically insulative caps within the trenches and over the bitlines; and
   after forming the electrically conductive bitline material and prior to forming the electrically insulative caps, forming electrically conductive structures extending through the intervening regions of the electrically insulative material.

6. The method of claim 5 wherein:
   the trenches are formed to have faceted top portions sloping upwardly to the intervening regions of the insulative material;
   the electrically conductive bitline material that fills the openings is formed to extend over the faceted top portions;
   an etch selective for the insulative material relative to the electrically conductive bitline material is utilized to form openings in the intervening regions of the electrically insulative material; and
   the forming the electrically conductive structures comprises forming electrically conductive material within said openings.

7. The method of claim 6 wherein:
   an individual trench of said plurality of trenches has, in a cross-sectional view, a bottom periphery with a pair of substantially vertically extending sidewall extending upwardly from the bottom periphery; the sidewalls defining a pair of normal axes and being on opposing sides of the trench relative to one another;
   a pair of the facets are associated with said individual trench in the cross-sectional view, with the individual facets of said pair being associated with individual sidewalls; and
   the individual facets of the pair are angled relative to the normal axes of the sidewalls by from about 10° to about 45°.

8. The method of claim 7 wherein the individual facets of the pair are angled relative to the normal axes of the sidewalls by from 30° to about 45°.

9. The method of claim 5 wherein the electrically conductive bitline material comprises one or more of titanium, titanium nitride, tungsten nitride and tungsten.

10. The method of claim 5 further comprising forming a plurality of capacitors having storage nodes electrically coupled with the electrically conductive structures.

11. A method of forming a semiconductor construction, comprising:
providing a semiconductor substrate having a defined memory array region; the semiconductor substrate comprising, within the memory array region, a plurality of storage node contacts covered by an electrically insulative material; the semiconductor substrate comprising a monocrystalline silicon wafer supporting the storage node contacts;
forming trenches within the insulative material; the trenches having faceted upper portions with facets sloping upwardly and outwardly relative to interior regions of the trenches; uppermost and outermost edges of facets of adjacent trenches being spaced from one another by intervening regions of the electrically insulative material;
forming electrically conductive bitline material to within the trenches and over the facets, but not over the intervening regions of the electrically insulative material;
using the electrically conductive bitline material as a mask during an etch through the intervening regions of the electrically insulative material to the storage node contacts, the etch through the intervening regions forming openings that extend through the intervening regions to the storage node contacts;
forming electrically conductive interconnect material within the openings and electrically coupled to the storage node contacts;
after forming the interconnect material, recessing the electrically conductive bitline material within the trenches to form unfilled regions of the trenches above the electrically conductive bitline material; and
forming electrically insulative caps within the unfilled regions of the trenches over the electrically conductive bitline material.

12. The method of claim 11 wherein the electrically insulative caps extend over the facets but not over the electrically conductive interconnect material.

13. The method of claim 11 wherein:
the substrate has a defined peripheral region which is peripheral to the memory array region;
the insulative material extends over the peripheral region;
the trenches formed within the memory array region are first trenches, and at least one second trench is formed within the peripheral region simultaneously with the formation of the first trenches; and
the electrically conductive bitline material is formed and recessed within said at least one second trench simultaneously with the formation and recessing of the electrically conductive bitline material within the first trenches.

14. The method of claim 11 further comprising forming a plurality of capacitors having storage nodes electrically coupled with the electrically conductive interconnect material.

15. A method of forming a semiconductor construction, comprising:
forming trenches within an electrically insulative material; the trenches having faceted upper portions with facets sloping upwardly and outwardly relative to interior regions of the trenches; uppermost and outermost edges of facets of adjacent trenches being spaced from one another by intervening regions of the electrically insulative material; the electrically insulative material being over storage node contacts supported by a semiconductor substrate;
filling the trenches with electrically conductive bitline material, the electrically conductive bitline material extending over the trench faceted portions but not over the intervening regions of the electrically insulative material;
utilizing the electrically conductive bitline material as a mask during an etch to form first openings extending through the intervening regions of the electrically insulative material to the storage node contacts;
forming a filler material within the first openings;
after forming the filler material, recessing the electrically conductive bitline material within the trenches to form unfilled regions of the trenches above the electrically conductive bitline material;
forming electrically insulative caps within said unfilled regions of the trenches;
after forming the electrically insulative caps, removing at least some of the filler material to form second openings extending to the storage node contacts; and
forming electrically conductive interconnect material within the second openings and electrically coupled to the storage node contacts.

16. The method of claim 15 wherein the filling of the trenches with the electrically conductive bitline material comprises:
providing the electrically conductive bitline material to fill the trenches and extend over the intervening regions of the insulative material; and
planarizing the electrically conductive bitline material remove the electrically conductive bitline material from over the intervening regions of the insulative material while leaving the electrically conductive bitline material over the faceted upper portions.

17. The method of claim 15 wherein:
an individual trench of said plurality of trenches has, in a cross-sectional view, a bottom periphery with a horizontally-extending width;
a pair of the facets are associated with said individual trench in the cross-sectional view, with the individual facets of said pair being on opposing sides of the individual trench relative to one another; and
the individual facets of the pair have horizontally-extending widths in the cross-sectional view of from about 10% to about 110% of the horizontally-extending width of the bottom periphery.

18. The method of claim 15 wherein:
an individual trench of said plurality of trenches has, in a cross-sectional view, a bottom periphery with a horizontally-extending width of at least about 50 Å;
a pair of the facets are associated with said individual trench in the cross-sectional view, with the individual facets of said pair being on opposing sides of the individual trench relative to one another; and
the individual facets of the pair have horizontally-extending widths in the cross-sectional view of from about 50 < to about 10 Å.

19. The method of claim 15 wherein the filler material comprises a spin-on dielectric.

* * * * *

UNITED STATES PATENT AND TRADEMARK OFFICE
CERTIFICATE OF CORRECTION

PATENT NO.        : 7,517,754 B2                                     Page 1 of 1
APPLICATION NO.   : 11/971747
DATED             : April 14, 2009
INVENTOR(S)       : McDaniel et al.

It is certified that error appears in the above-identified patent and that said Letters Patent is hereby corrected as shown below:

In column 14, line 49, in Claim 17, delete "110%" and insert -- 400% --, therefor.

In column 14, lines 60-61, in Claim 18, delete "50 < to about 10Å." and insert -- 50Å to about 300Å. --, therefor.

Signed and Sealed this

Fourteenth Day of July, 2009

JOHN DOLL
*Acting Director of the United States Patent and Trademark Office*